(12) United States Patent
Yoneda

(10) Patent No.: US 8,659,015 B2
(45) Date of Patent: Feb. 25, 2014

(54) SEMICONDUCTOR DEVICE

(75) Inventor: Seiichi Yoneda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 17 days.

(21) Appl. No.: 13/403,311

(22) Filed: Feb. 23, 2012

(65) Prior Publication Data

US 2012/0223304 A1 Sep. 6, 2012

(30) Foreign Application Priority Data

Mar. 4, 2011 (JP) .................................. 2011-047460
May 18, 2011 (JP) .................................. 2011-111004

(51) Int. Cl.
*H01L 29/10* (2006.01)
(52) U.S. Cl.
USPC .............................. 257/43; 235/492; 327/306
(58) Field of Classification Search
USPC .............................. 235/492; 257/43; 327/306
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,427,065 B1 | 7/2002 | Suga et al. | |
| 6,563,174 B2 | 5/2003 | Kawasaki et al. | |
| 6,624,743 B1 | 9/2003 | Ikefuji et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nomura et al., Amorphous Oxide Semiconductors for High-Performance Flexible Thin-Film Transistors, 2006, Japanese Journal of Applied Physics, vol. 45, No. 5B, pp. 4303-4308.*

(Continued)

*Primary Examiner* — Zandra Smith
*Assistant Examiner* — Sophia Nguyen
(74) *Attorney, Agent, or Firm* — Eric J. Robinson; Robinson Intellectual Property Law Office, P.C.

(57) ABSTRACT

A semiconductor device includes an antenna functioning as a coil, a capacitor electrically connected to the antenna in parallel, a passive element forming a resonance circuit with the antenna and the capacitor by being electrically connected to the antenna and the capacitor in parallel, a first field effect transistor controlling whether the passive element is electrically connected to the antenna and the capacitor in parallel or not, and a memory circuit. The memory circuit includes a second field effect transistor which includes an oxide semiconductor layer where a channel is formed and in which a data signal is input to one of a source and a drain. The gate voltage of the first field effect transistor is set depending on the voltage of the other of the source and the drain of the second field effect transistor.

22 Claims, 26 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,907,902 | B2 | 3/2011 | Kato et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0150475 | A1 | 6/2008 | Kato et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0072285 | A1* | 3/2010 | Nishijima ............ 235/492 |
| 2010/0092800 | A1 | 4/2010 | Itagaki et al. |
| 2010/0109002 | A1 | 5/2010 | Itagaki et al. |
| 2011/0163613 | A1 | 7/2011 | Kato et al. |
| 2011/0187435 | A1* | 8/2011 | Kamata ............ 327/306 |
| 2011/0309689 | A1 | 12/2011 | Kamata |
| 2012/0062430 | A1* | 3/2012 | Nishijima ............ 343/703 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-260580 A | 9/2001 |
| JP | 2002-076356 A | 3/2002 |
| JP | 2002-289859 A | 10/2002 |
| JP | 2003-067693 | 3/2003 |
| JP | 2003-067693 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004 , vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generational Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFT's Array,", SID Digest '08 SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009 pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007 vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in The IN2O3 and SC2O3-A2O3-BO Systems [A; Fe, Ga, or AL; B:Mg, Mn, Fe, Ni, Cu, or Zn] at Temperatures over 1000°C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Sympoisum Digest of Technical Papers, 2008, vol. 39, pp. 1277-1280.

Janotti.A et al., "Oxygen Vacancies in ZnO,", Appl; Phys. Lett. (Applied Physics Letters), 2005,vol. 87, pp. 122102-1-122102-3.

Oba.F et al., "Defect energetics in ZnO: A hybrid Hartree-Fock density functional study,", Phys. Rev. B (Physsical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996 vol 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & TechnologyB), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155 No. 12, pp. H1009-H1014.

Ueno.K et al., "Field-Effect Transistor on SrTiO3 With Sputtered Al2O3 Gate Insulator,", Appl. Phys. Lett. (Applied Physics Letters) ,Sep. 1, 2003, vol. 83, No. 9, pp. 1755-1757.

\* cited by examiner

PE

PE

FIG. 11A  FIG. 11B
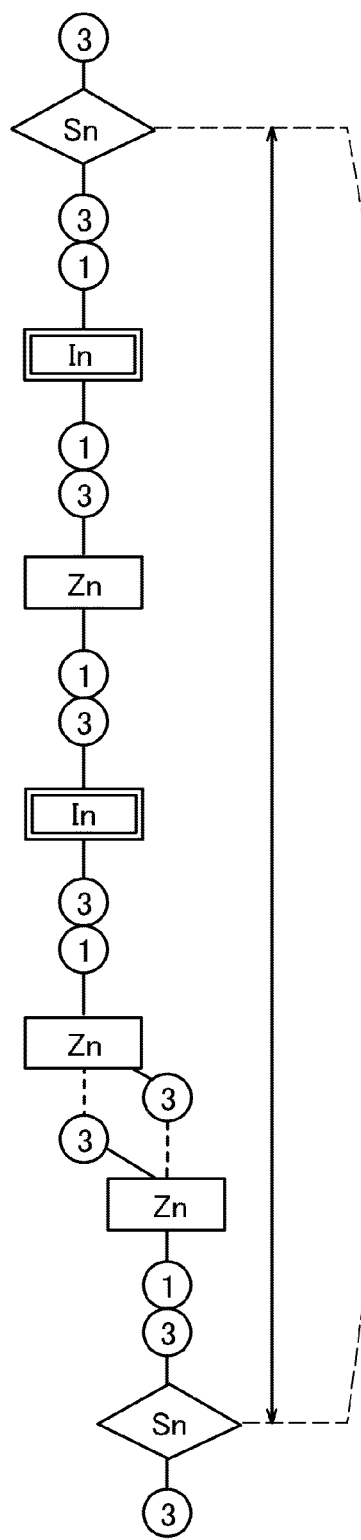
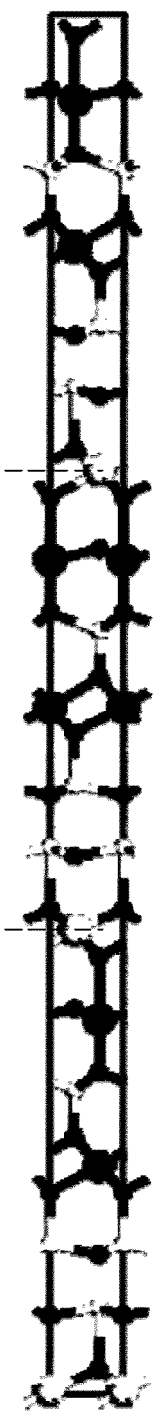
FIG. 11C
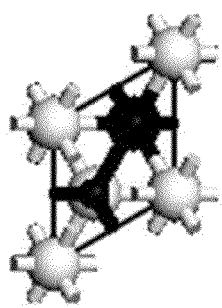
● In
☾ Sn
◦ Zn
● O

SEMICONDUCTOR DEVICE

BACKGROUND OF THE INVENTION

1. Field of the Invention

One embodiment of the present invention relates to a semiconductor device.

2. Description of the Related Art

In recent years, semiconductor devices have been developed which are capable of supplying (also referred to as feeding) power (also referred to as a power supply voltage) through wireless communication, and further capable of transmitting and receiving data (also referred to as data communication) through wireless communication. For example, if a feeding function through wireless communication can be added to a portable information terminal (e.g., a cellular phone) which is an example of the semiconductor devices, the portable information terminal does not need to be connected to an external power feeding portion and can be fed more easily, for example, in any environment.

An individual identification technology utilizing a radio frequency identification (RFID) tag is known as an example of semiconductor devices capable of data transmission, data reception, data storing, data erasing, and the like through wireless communication. The RFID tag is also referred to as an RF tag, a wireless tag, an electronic tag, or a wireless chip. The RFID tag is also referred to as an IC tag, an IC chip, or an IC card because it includes a functional circuit such as an integrated circuit (IC) for executing authentication or other processing. Data communication with the semiconductor device is performed by using a wireless communication device (such as a reader/writer, which is capable of transmitting and receiving a data signal through wireless communication). The individual identification technology using the semiconductor device is used for the production, management, or the like of an individual object and has been expected to be applied to personal authentication.

In the semiconductor device, the resonant inductance is set by a coil (antenna) or the like and the resonant capacitance is set by a capacitor or the like to set the resonance frequency, whereby a value of a power supply voltage to be supplied is set. However, an actual resonance frequency differs from a desired resonance frequency due to variations in a manufacturing process, in some cases. In that case, the resonance frequency needs to be readjusted after the process is finished.

As a measure against the above problem, a semiconductor device in which the resonance frequency is set at an optimal level by a resonance frequency adjustment circuit has been known (e.g., Patent Document 1).

In the semiconductor device disclosed in Patent Document 1, whether a capacitor is connected to an antenna in parallel or not is controlled by setting of a gate voltage of a control transistor. For example, when the control transistor is turned on and the capacitor is connected to the antenna in parallel, the resonance frequency changes.

REFERENCE

Patent Document

[Patent Document 1] Japanese Published Patent Application No. 2003-67693

SUMMARY OF THE INVENTION

However, in a semiconductor device capable of adjusting the resonance frequency, such as the semiconductor device disclosed in Patent Document 1, although once the gate voltage of a control transistor is set and the resonance frequency is set, the gate voltage of the control transistor is changed by a leakage current or the like of an element in a circuit, so that the resonance frequency differs from a desired resonance frequency. For this reason, the readjustment of the resonance frequency is necessary every time the resonance frequency differs from a desired resonance frequency due to a leakage current or the like; therefore, the adjustment of the resonance frequency is complicated.

An object of one embodiment of the present invention is to simplify an adjustment of resonance frequency.

In one embodiment of the present invention, a coil, a capacitor, a passive element forming a resonance circuit when electrically connected to the coil and the capacitor, and a control transistor that controls whether the passive element is electrically connected to the coil and the capacitor or not are provided. A memory circuit using a transistor with low off-state current holds data, so that the gate voltage of the control transistor is held. With the use of the memory circuit using the transistor with low off-state current, change in the gate voltage of the control transistor due to a leakage current or the like is suppressed and the resonance frequency is easily adjusted.

One embodiment of the present invention is a semiconductor device including a coil, a capacitor electrically connected to the coil in parallel, a passive element forming a resonance circuit with the coil and the capacitor by being electrically connected to the coil and the capacitor in parallel, a first field effect transistor controlling whether the passive element is electrically connected to the coil and the capacitor in parallel or not, and a memory circuit. The memory circuit includes a second field effect transistor which includes an oxide semiconductor layer where a channel is formed and in which a data signal is input to one of a source and a drain. A gate voltage of the first field effect transistor is set depending on a voltage of the other of the source and the drain of the second field effect transistor.

According to one embodiment of the present invention, the gate voltage of the control transistor can be easily set, so that the resonance frequency can be easily adjusted.

BRIEF DESCRIPTION OF THE DRAWINGS

FIG. 2 shows an example of a semiconductor device.

FIGS. 11A to 11C show a structure of an oxide material.

DETAILED DESCRIPTION OF THE INVENTION

Examples of embodiments describing the present invention will be described below with reference to the drawings. Note that it is easy for those skilled in the art to change contents in an embodiment without departing from the spirit and the scope of the present invention. The present invention is therefore not limited to the following description of the embodiments.

Note that the contents of the embodiments can be combined with each other as appropriate. In addition, the contents of the embodiments can be replaced with each other.

Further, the ordinal numbers such as "first" and "second" are used to avoid confusion between components and do not limit the number of each component.
(Embodiment 1)

In this embodiment, an example of a semiconductor device in which the resonance frequency can be adjusted will be described.

An example of the semiconductor device in this embodiment will be described with reference to FIGS. 1A, 1B-1, 1B-2, and 1C.

Figure 1A:
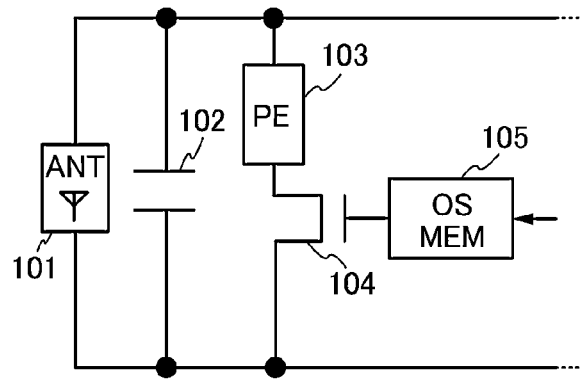
FIGS. 1A, 1B-1, 1B-2, and 1C show an example of a semiconductor device.
Figures 1, 1B:
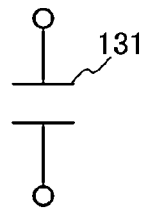

The semiconductor device shown in FIG. 1A includes an antenna (also referred to as ANT) 101, a capacitor 102, a passive element (also referred to as PE) 103, a transistor 104, and a memory circuit (also referred to as OSMEM) 105.

Note that the transistor includes two terminals and a current control terminal for controlling current flowing between the two terminals by voltage applied. Note that without limitation to the transistor, in an element, terminals between which current flows and the current is controlled are also referred to as current terminals. Two current terminals are also referred to as a first current terminal and a second current terminal.

A field effect transistor can be used as the transistor, for example. In a field effect transistor, a first current terminal, a second current terminal, and a current control terminal are one of a terminal serving as a source and a drain, a terminal serving as the other of the source and the drain, and a terminal serving as a gate, respectively.

Voltage generally refers to a difference between electric potentials at two points (also referred to as an electric potential difference). However, values of both a voltage and a potential are represented using volt (V) in a circuit diagram or the like in some cases, so that it is difficult to discriminate between them. This is why in this specification, an electric potential difference between an electric potential at one point and an electric potential to be the reference (also referred to as the reference electric potential) is used as a voltage at the point in some cases.

The capacitor includes a first electrode, a second electrode, and a dielectric layer overlapping with the first electrode and the second electrode. An electrode functioning as an electrode in the capacitor is also referred to as a capacitor electrode.

The antenna 101 has a function of a coil. The antenna 101 includes a first terminal and a second terminal, for example. Note that a terminal included in the antenna 101 is also referred to as an antenna terminal.

The capacitor 102 is electrically connected to the antenna 101 in parallel. For example, a first capacitor electrode of the capacitor 102 is electrically connected to a first antenna terminal of the antenna 101 and a second capacitor electrode of the capacitor 102 is electrically connected to a second antenna terminal of the antenna 101. Note that a switching element such as a transistor may be provided between the antenna 101 and one or both of the first capacitor electrode and the second capacitor electrode of the capacitor 102.

The passive element 103 forms a resonance circuit when electrically connected to the antenna 101 and the capacitor 102 in parallel. For example, one terminal of the passive element 103 is electrically connected to the first antenna terminal of the antenna 101.

As the passive element 103, a capacitor (e.g., a capacitor 131 in FIG. 1B-1), an element functioning as a coil (e.g., an antenna 132 in FIG. 1B-2), or the like can be used.

The transistor 104 has a function of controlling whether the passive element 103 is electrically connected to the antenna 101 and the capacitor 102 in parallel or not, and is also referred to as a control transistor. For example, when the transistor 104 is turned on, the passive element 103 is electrically connected to the antenna 101 and the capacitor 102 in parallel through a source and a drain of the transistor 104. Further, one of the source and the drain of the transistor 104 is electrically connected to one terminal of the passive element 103, and the other of the source and the drain of the transistor 104 is electrically connected to the second antenna terminal of the antenna 101, for example.

The memory circuit 105 has a function of holding the gate voltage of the transistor 104.

The memory circuit 105 includes a field effect transistor with low off-state current. A data signal is input to one of a source and a drain of the field effect transistor with low off-state current, and the gate voltage of the transistor 104 is set depending on the voltage of the other of the source and the drain of the field effect transistor with low off-state current. Note that the other of the source and the drain of the field effect transistor with low off-state current may be electrically connected to the gate of the transistor 104. In the semiconductor device in this embodiment, the operation of the memory circuit 105 may be controlled in such a manner that a memory control circuit is provided, and a control signal and a data signal are input with the use of the memory control circuit.

As the field effect transistor with low off-state current, a field effect transistor including an oxide semiconductor layer is given as an example. The field effect transistor including an oxide semiconductor layer has an off-state current lower than that of a conventional transistor layer of a semiconductor layer of silicon or the like. The band gap of the oxide semiconductor layer is greater than that of silicon. The band gap of the oxide semiconductor layer is preferably greater than or equal to 2 eV, more preferably greater than or equal to 2.5 eV, further preferably greater than or equal to 3 eV. The oxide semiconductor layer is an intrinsic (also referred to as an i-type) or substantially intrinsic semiconductor layer. The off-state current per micrometer of channel width of a transistor including the oxide semiconductor layer is lower than or equal to 1 zA ($1\times10^{-17}$ A), preferably lower than or equal to 1 zA ($1\times10^{-18}$ A), more preferably lower than or equal to 10 zA ($1\times10^{-20}$ A), further preferably lower than or equal to 1 zA ($1\times10^{-21}$ A), still further preferably lower than or equal to 100 zA ($1\times10^{-22}$ A).

As the transistor 104, for example, it is possible to use a transistor including the oxide semiconductor layer or a transistor including a semiconductor layer which includes a semiconductor belonging to Group 14 of the periodic table (e.g., silicon) and in which a channel is formed.

Note that another functional circuit may be provided so as to be electrically connected to the antenna 101 in parallel. The functional circuit is a circuit that has a specific function when voltage is applied.

Next, the operation of the semiconductor device shown in FIG. 1A will be described as an operation example of the semiconductor device of this embodiment.

In the semiconductor device shown in FIG. 1A, the resonance circuit includes the coil (e.g., the antenna 101) and the capacitor. In that case, it is preferable to set the capacitance value of the capacitor 102 so that a voltage needed to operate the semiconductor device is supplied. Since the semiconductor device shown in FIG. 1A is a semiconductor device with an electromagnetic induction method, a voltage is generated depending on the resonance frequency of the semiconductor device when the antenna 101 receives an electric wave. The generated voltage is input to another functional circuit of the semiconductor device. Further, data may be input to the semiconductor device when the antenna 101 receives an electric wave.

In addition, the resonance frequency of the semiconductor device can be adjusted by turning on or off the transistor 104. For example, the field effect transistor with low off-state current in the memory circuit 105 is turned on and a data signal is input to the memory circuit 105, whereby data of the data signal is held in the memory circuit 105 and the gate voltage of the transistor 104 is set in response to the voltage of the data signal. Note that as the data signal, a digital data signal or an analogue data signal can be used. For example, when an analogue data signal is used, the amount of change in a current flowing between the source and the drain of the transistor 104 in an on state can be an analogue value; thus, the resonance frequency of the semiconductor device can be adjusted more accurately.

In that case, the resistance value of a channel of the transistor 104 is changed depending on the gate voltage of the transistor 104, so that the resonance frequency of the semiconductor device is changed. The resonance frequency f is expressed by the following formula.

$$f = \frac{1}{2\pi\sqrt{LC}}$$ [Formula 1]

L indicates the inductance of a coil or the like and C indicates the capacitance of a capacitor or the like.

Figures 1, 1B, 2:
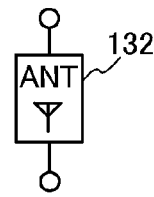
Figure 1C:
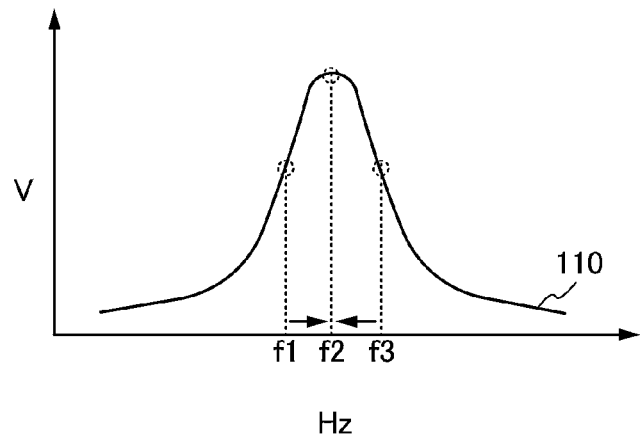
Figure 2:
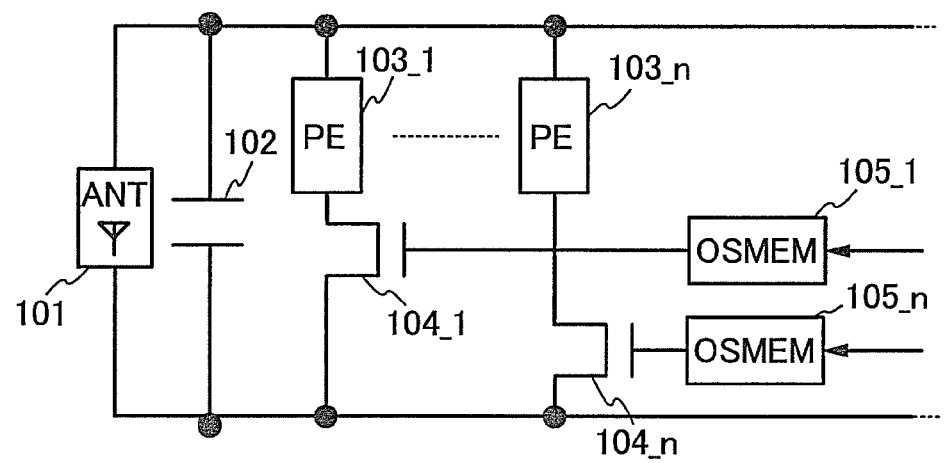

FIG. 1C is a graph showing the relation between the resonance frequency and a voltage which is generated in the case where the passive element 103 is an antenna functioning as a coil in the semiconductor device. For example, as shown in FIG. 1C, when the transistor 104 is in an off state and the value of the resonance frequency is f1, the value of the resonance frequency can be changed from f1 to f2, with which a large voltage is generated, by turning on the transistor 104. Further, when the transistor 104 is in an on state and the value of the resonance frequency is f3, the value of the resonance frequency can be changed from f3 to f2, with which a large voltage is generated, by turning off the transistor 104.

The above is the description of the operation example of the semiconductor device shown in FIG. 1A.

Note that as shown in FIG. 2, for example, a plurality of circuits each including the passive element 103, the transistor 104, and the memory circuit 105 (also referred to as resonance frequency adjustment circuits) may be provided. A semiconductor device shown in FIG. 2 includes the antenna 101, the n (n is a natural number greater than or equal to two) passive elements 103 (passive elements 103_1 to 103_n), the n transistors 104 (transistors 104_1 to 104_n), and the n memory circuits 105 (memory circuits 105_1 to 105_n).

The m-th (m is a natural number of 1 to n) transistor 104_m controls whether the m-th passive element 103_m and the antenna 101 are electrically connected to each other in parallel or not. The gate voltage of the m-th transistor 104_m is held by the m-th memory circuit 105_m. Note that data held in each memory circuit 105 may be set individually.

When the plurality of resonance frequency adjustment circuits is provided, the amount of change in the resonance frequency of the semiconductor device can be an analogue value, so that the resonance frequency of the semiconductor device can be adjusted more accurately.

As described with reference to FIGS. 1A, 1B-1, 1B-2, and 1C and FIG. 2, in an example of the semiconductor device in this embodiment, whether the passive element forms the resonance circuit with another element or not is controlled by controlling an on state or an off state of the control transistor, whereby the resonance frequency of the semiconductor device can be changed as appropriate. Consequently, for example, in the case where the resonance frequency of the semiconductor device differs from a desired value when the semiconductor device is manufactured, the resonance frequency can be adjusted to be a desired value.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. The memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

(Embodiment 2)

In this embodiment, an example of the semiconductor device described in Embodiment 1 will be described.

An example of a semiconductor device in this embodiment will be described with reference to FIG. 3. Note that in FIG. 3, the description of the semiconductor device shown in FIG. 1A is used as appropriate for components denoted by the same reference numerals as those in the semiconductor device shown in FIG. 1A.

Figure 3:
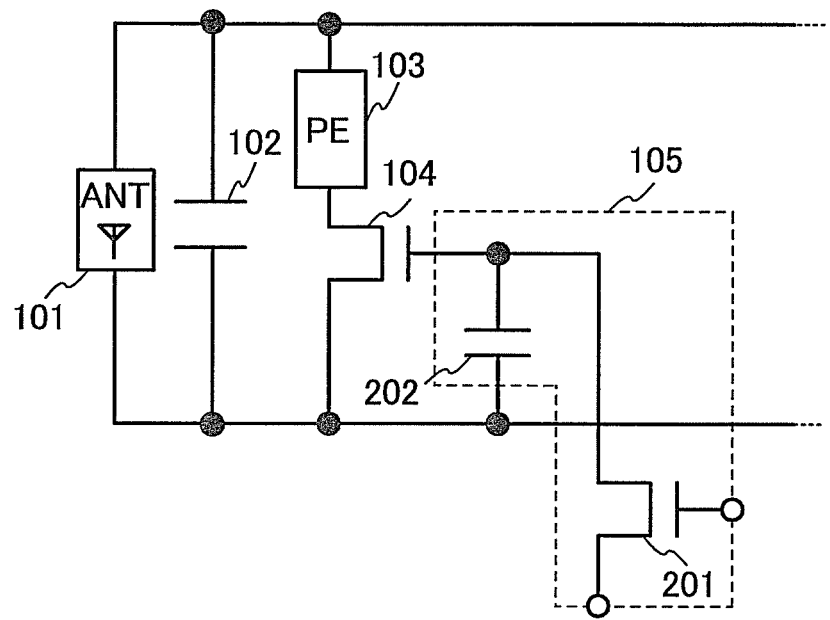
FIG. 3 shows an example of a semiconductor device.

The semiconductor device shown in FIG. 3 includes the antenna 101, the capacitor 102, the passive element 103, the transistor 104, and the memory circuit 105, similarly to the semiconductor device shown in FIG. 1A.

The antenna 101 functions as a coil.

The capacitor 102 is electrically connected to the antenna 101 in parallel.

The passive element 103 forms a resonance circuit when electrically connected to the antenna 101 and the capacitor 102 in parallel.

The transistor 104 has a function of controlling whether the passive element 103 is electrically connected to the antenna 101 and the capacitor 102 in parallel or not. For example, one of the source and the drain of the transistor 104 is electrically connected to the passive element 103.

Moreover, the memory circuit 105 shown in FIG. 3 includes a transistor 201 and a capacitor 202.

A data signal is input to one of a source and a drain of the transistor 201 and the other of the source and the drain of the transistor 201 is electrically connected to the gate of the transistor 104.

As the transistor 201, a field effect transistor with low off-state current, such as the transistor including an oxide semiconductor layer described in the above embodiment, can be used.

Further, for example, the operation of the transistor 201 may be controlled in such a manner that a control signal is supplied to a gate of the transistor 201 with the use of an arithmetic circuit, a memory, and the like, and a data signal is supplied to the one of the source and the drain of the transistor 201.

A first capacitor electrode of the capacitor 202 is electrically connected to the gate of the transistor 104. A second capacitor electrode of the capacitor 202 is supplied with a given voltage or the second capacitor electrode of the capacitor 202 is grounded. Note that the capacitor 202 is not necessarily provided.

Next, the operation of the semiconductor device shown in FIG. 3 will be described as an operation example of the semiconductor device of this embodiment.

In the semiconductor device shown in FIG. 3, when the antenna 101 receives an electric wave, a voltage is generated depending on the resonance frequency of the semiconductor device. The generated voltage is input to another functional circuit in the semiconductor device, for example.

In addition, the resonance frequency of the semiconductor device can be adjusted by turning on or off the transistor 104.

When the gate voltage of the transistor 104 is set, the transistor 201 is turned on.

When the transistor 201 is in an on state, the gate voltage of the transistor 104 is equal to the voltage of a data signal.

Then, the transistor 201 is turned off. Since the transistor 201 has low off-state current, the gate voltage of the transistor 104 can be held by turning off the transistor 201. Thus, the gate voltage of the transistor 104 can be set.

The above is the description of the operation example of the semiconductor device shown in FIG. 3.

As described with reference to FIG. 3, in an example of the semiconductor device in this embodiment, whether the passive element forms the resonance circuit with another element or not is controlled by controlling an on state or an off state of the control transistor, whereby the resonance frequency of the semiconductor device can be changed as appropriate. Consequently, for example, in the case where the resonance frequency of the semiconductor device differs from a desired value when the semiconductor device is manufactured, the resonance frequency can be adjusted to be a desired value.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. In the memory circuit including the transistor with low off-state current, data (voltage) that is held does not change semipermanently. In other words, the memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

(Embodiment 3)

In this embodiment, another example of the semiconductor device described in Embodiment 1 will be described.

Figure 4A:
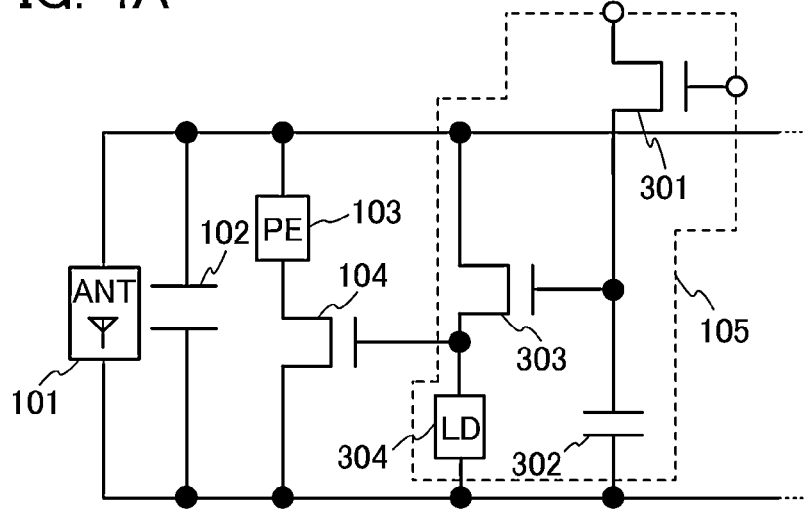
FIGS. 4A and 4B show examples of a semiconductor device.
Figure 4B:
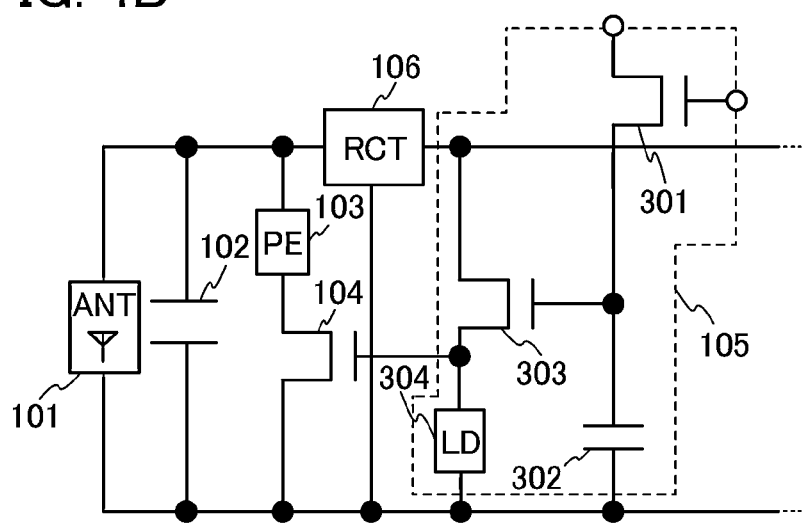

Examples of memory circuits in this embodiment will be described with reference to FIGS. 4A and 4B. FIGS. 4A and 4B are diagrams for describing the memory circuits in this embodiment. Note that in FIGS. 4A and 4B, the description of the semiconductor device shown in FIG. 1A is used as appropriate for components denoted by the same reference numerals as those in the semiconductor device shown in FIG. 1A.

Semiconductor devices shown in FIGS. 4A and 4B each include the antenna 101, the capacitor 102, the passive element 103, the transistor 104, and the memory circuit 105 similarly to the semiconductor device shown in FIG. 1A.

The antenna 101 functions as a coil.

The capacitor 102 is electrically connected to the antenna 101 in parallel.

The passive element 103 forms a resonance circuit when electrically connected to the antenna 101 and the capacitor 102 in parallel.

The transistor 104 has a function of controlling whether the passive element 103 is electrically connected to the antenna 101 and the capacitor 102 in parallel or not. For example, one of the source and the drain of the transistor 104 is electrically connected to the passive element 103.

Moreover, the memory circuits 105 shown in FIGS. 4A and 4B each include a transistor 301, a capacitor 302, a transistor 303, and an electronic element (also referred to as an LD) 304 serving as a load.

A data signal is input to one of a source and a drain of the transistor 301.

As the transistor 301, a field effect transistor with low off-state current, such as the transistor including an oxide semiconductor layer described in the above embodiment, can be used.

Further, for example, the operation of the transistor 301 may be controlled in such a manner that a control signal is supplied to a gate of the transistor 301 with the use of an arithmetic circuit, a memory, and the like, and a data signal is supplied to one of a source and a drain of the transistor 301.

A first capacitor electrode of the capacitor 302 is electrically connected to the other of the source and the drain of the transistor 301. A given voltage is applied to a second capacitor electrode of the capacitor 302. Further, one embodiment of the present invention is not limited to this, and the second capacitor electrode of the capacitor 302 may be grounded. Note that the capacitor 302 is not necessarily provided.

The voltage of one of a source and a drain of the transistor 303 is changed depending on an electric wave received by the antenna 101. The other of the source and the drain of the transistor 303 is electrically connected to the gate of the transistor 104. A gate of the transistor 303 is electrically connected to the other of the source and the drain of the transistor 301. For example, the one of the source and the drain of the transistor 303 is electrically connected to the first antenna terminal of the antenna 101. The other of the source and the drain of the transistor 303 is electrically connected to the second antenna terminal of the antenna 101 through the electronic element 304 serving as a load.

It is preferable to use, for example, a p-channel transistor as the transistor 303. As the transistor 303, a transistor that includes a semiconductor layer including a semiconductor (e.g., silicon) belonging to Group 14 of the periodic table can be used, for example.

The electronic element 304 serving as a load has a function of resetting the voltage of the other of the source and the drain of the transistor 303 to have a reference value. As examples of the electronic element 304 serving as a load, a resistor, a diode, and a switching element are given. As a switching element, a transistor or the like is given, for example. Note that the electronic element 304 serving as a load is not necessarily provided and parasitic resistance or the like may be used instead of the electronic element 304 serving as a load.

The semiconductor device shown in FIG. 4B includes a rectifier circuit 106. The rectifier circuit 106 has a function of rectifying a voltage generated by receiving an electric wave by the antenna 101. Note that although the rectifier circuit 106 is not necessarily provided, deterioration of the transistor 303 due to application of voltage can be suppressed with the rectifier circuit 106.

Next, the operation of the semiconductor device shown in FIG. 4A will be described as an operation example of the semiconductor device of this embodiment.

In the semiconductor device shown in FIG. 4A, when the antenna 101 receives an electric wave, a voltage is generated depending on the resonance frequency of the semiconductor device. The generated voltage is input to another functional circuit of the semiconductor device, for example.

Moreover, in the semiconductor device shown in FIG. 4A, when a voltage with which an element is broken is supplied by receiving an electric wave by the antenna 101, the gate voltage of the transistor 104 is changed and the resistance value of the channel of the transistor 104 is changed, so that the resonance frequency can be changed. An example of the above method will be described.

First, the transistor 301 is turned on.

When the transistor 301 is in an on state, the gate voltage of the transistor 303 is equal to the voltage of a data signal. The voltage of the data signal is set depending on the value of the voltage with which an element is broken.

Then, the transistor 301 is turned off. Since the transistor 301 is a transistor with low off-state current, the gate voltage of the transistor 303 can be held by turning off the transistor 301. Thus, the gate voltage of the transistor 303 can be set.

In that case, when a value of a voltage generated by receiving an electric wave by the antenna 101 is not a voltage with which an element is broken, the transistor 303 is in an off state. At this time, the gate voltage of the transistor 104 is reset to the reference value by the electronic element 304 serving as a load.

When a value of a voltage generated by receiving an electric wave by the antenna 101 is a voltage with which an element is broken, the transistor 303 is turned on depending on the voltage between the gate and the source of the transistor 303. When the transistor 303 is turned on, the gate voltage of the transistor 104 is changed. Consequently, the resistance value of the channel of the transistor 104 is changed depending on the gate voltage of the transistor 104 and the transistor 104 is turned on, so that the resonance frequency is changed.

The above is the description of the operation example of the semiconductor device shown in FIG. 4A.

As described with reference to FIGS. 4A and 4B, in an example of the semiconductor device in this embodiment, whether the passive element forms the resonance circuit with another element or not is controlled by controlling an on state or an off state of the control transistor, whereby the resonance frequency of the semiconductor device can be changed as appropriate. Consequently, for example, in the case where the resonance frequency of the semiconductor device differs from a desired value when the semiconductor device is manufactured, the resonance frequency can be adjusted to be a desired value.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. In the memory circuit including the transistor with low off-state current, data (voltage) that is held does not change semipermanently. In other words, the memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

In an example of the semiconductor device in this embodiment, the resonance frequency can be changed depending on a voltage supplied by receiving an electric wave by the antenna. Thus, when a voltage with which an element might be broken is applied, the value of a generated voltage can be adjusted by changing the resonance frequency. Consequently, a circuit including the passive element and the control transistor can function as a protection circuit, and the reliability of the semiconductor device can be improved.

(Embodiment 4)

In this embodiment, another example of the semiconductor device described in Embodiment 1 will be described.

Figure 5A:
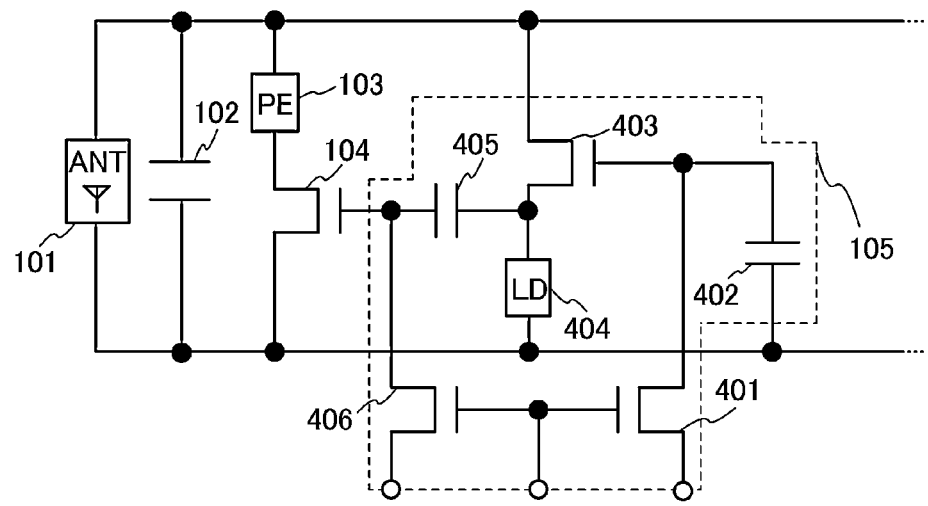
FIGS. 5A and 5B show examples of a semiconductor device.
Figure 5B:
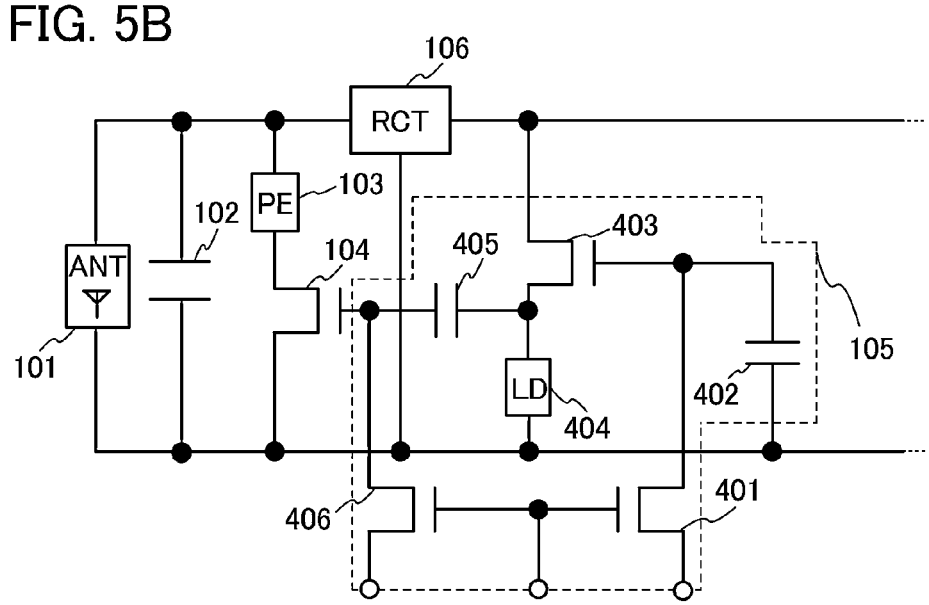

Examples of semiconductor devices in this embodiment will be described with reference to FIGS. 5A and 5B. FIGS. 5A and 5B are diagrams for describing the examples of the semiconductor devices in this embodiment. Note that in FIGS. 5A and 5B, the description of the semiconductor device shown in FIG. 1A is used as appropriate for components denoted by the same reference numerals as those in the semiconductor device shown in FIG. 1A.

The semiconductor devices shown in FIGS. 5A and 5B each include the antenna 101, the capacitor 102, the passive element 103, the transistor 104, and the memory circuit 105 as in the semiconductor device shown in FIG. 1A.

The antenna 101 functions as a coil.

The capacitor 102 is electrically connected to the antenna 101 in parallel.

The passive element 103 forms a resonance circuit when electrically connected to the antenna 101 and the capacitor 102 in parallel.

The transistor 104 has a function of controlling whether the passive element 103 is electrically connected to the antenna 101 and the capacitor 102 in parallel or not. For example, one of the source and the drain of the transistor 104 is electrically connected to the passive element 103.

Moreover, the memory circuit 105 includes a transistor 401, a capacitor 402, a transistor 403, an electronic element 404 serving as a load, a capacitor 405, and a transistor 406.

A data signal D1 is input to one of a source and a drain of the transistor 401.

As the transistor 401, a field effect transistor with low off-state current, such as the transistor including an oxide semiconductor layer described in the above embodiment, can be used.

Further, for example, the operation of the transistor 401 may be controlled in such a manner that a control signal CTL1 is supplied to a gate of the transistor 401 with the use of an arithmetic circuit, a memory, and the like, and the data signal D1 is supplied to the one of the source and the drain of the transistor 401.

A first capacitor electrode of the capacitor 402 is electrically connected to the other of the source and the drain of the transistor 401. Note that the capacitor 402 is not necessarily provided.

The voltage of one of a source and a drain of the transistor 403 is changed depending on an electric wave received by the antenna 101, and a gate of the transistor 403 is electrically connected to the other of the source and the drain of the transistor 401. For example, the one of the source and the drain of the transistor 403 is electrically connected to the first antenna terminal of the antenna 101, the other of the source and the drain of the transistor 403 is electrically connected to the second antenna terminal of the antenna 101 through the electronic element 404 serving as a load.

It is preferable to use, for example, a p-channel transistor as the transistor 403. As the transistor 403, a transistor having a semiconductor layer including a semiconductor (e.g., silicon) belonging to Group 14 of the periodic table can be used, for example.

The electronic element 404 serving as a load has a function of resetting the voltage of the other of the source and the drain of the transistor 403 to have a reference value. As examples of the electronic element 404 serving as a load, a resistor, a diode, and a switching element are given. As a switching element, a transistor or the like is given, for example. Note that the electronic element 404 serving as a load is not necessarily provided and parasitic resistance or the like may be used instead of the electronic element 404 serving as a load.

A first capacitor electrode of the capacitor 405 is electrically connected to the other of the source and the drain of the transistor 403. A second capacitor electrode of the capacitor 405 is electrically connected to the gate of the transistor 104.

A data signal, which is the same as a data signal input to one of the source and the drain of the transistor 401, is input to one of the source and the drain of the transistor 406 and the other of the source and the drain of the transistor 406 is electrically connected to the gate of the transistor 104. Note that a data signal different from the data signal input to the one of the source and the drain of the transistor 401 (here, a data signal D2) may be input to the one of the source and the drain of the transistor 406.

As the transistor 406, a field effect transistor with low off-state current, such as the transistor including an oxide semiconductor layer described in the above embodiment, can be used.

Further, for example, the operation of the transistor 401 may be controlled in such a manner that a control signal CTL1, which is the same as the control signal CTL1 supplied to the gate of the transistor 401, is supplied to the gate of the transistor 406 with the use of an arithmetic circuit, a memory, and the like, and a data signal D1 or a data signal D2 is supplied to the one of the source and the drain of the transistor 401. A control signal different from the control signal input to the gate of the transistor 401 (here, a control signal CTL2) may be supplied to the gate of the transistor 406.

The semiconductor device shown in FIG. 5B includes the rectifier circuit 106. The rectifier circuit 106 has a function of rectifying a voltage generated by receiving an electric wave by the antenna 101. Note that although the rectifier circuit 106 is not necessarily provided, deterioration of the transistor 403 due to application of voltage can be suppressed with the rectifier circuit 106.

Next, the operation of the semiconductor device shown in FIG. 5A will be described as an operation example of the semiconductor devices shown in FIGS. 5A and 5B.

In the semiconductor device shown in FIG. 5A, when the antenna 101 receives an electric wave, a voltage is generated depending on the resonance frequency of the semiconductor device. The generated voltage is input to another functional circuit of the semiconductor device, for example.

Moreover, in the semiconductor device shown in FIG. 5A, when the gate voltage of the transistor 104 is set and a voltage with which an element might be broken is supplied by receiving an electric wave by the antenna 101, the gate voltage of the transistor 104 is changed and the resistance value of the channel of the transistor 104 is changed, so that the resonance frequency is changed, and then an electric wave is received by the antenna 101; thus, the gate voltage of the transistor 104 can be returned to a voltage that is previously set when a voltage with which an element is not broken is supplied. An example of the above method will be described.

First, the transistor 401 and the transistor 406 are turned on.

When the transistor 401 is in an on state, the gate voltage of the transistor 403 is equal to the voltage of a data signal D1.

When the transistor 406 is in an on state, the gate voltage of the transistor 104 is equal to the voltage of a data signal D1 or a data signal D2.

Note that when a value of the voltage of the data signal D1 is greater than a given value, the gate voltage of the transistor 403 is preferably set so that the transistor 403 is turned off. For example, in the case where the transistor 104 is an n-channel transistor and the transistor 403 is a p-channel transistor, the gate voltages of the transistor 104 and the transistor 403 are set to be greater than or equal to a power supply voltage. Thus, when the gate voltage of the transistor 104 is greater than or equal to a given value, application of a voltage more than necessary to the gate of the transistor 104 can be prevented even when a voltage with which an element might be broken is supplied by receiving an electric wave by the antenna 101. Further, when the gate voltage of the transistor 104 is set again, the gate voltage of the transistor 403 may be set again in response to the value of the data signal D1.

Then, the transistor 401 and the transistor 406 are turned off. Since the transistor 401 and the transistor 406 are transistors with low off-state current, the gate voltage of the transistor 403 can be held by turning off the transistor 401 and the transistor 406. Thus, the gate voltage of the transistor 403 can be set.

In that case, when a voltage with which an element is not broken is supplied by receiving an electric wave by the antenna 101, the value of the gate voltage of the transistor 104 becomes a value depending on an input data signal. At this time, the gate voltage of the transistor 104 is reset to the reference value by the electronic element 404 serving as a load.

Further, in the case where a value of the data signal D1 is a value that the transistor 104 is turned off and a value of a voltage supplied by receiving an electric wave by the antenna 101 is a value with which an element is broken, the transistor 403 is turned on depending on the voltage between the gate and one of the source and the drain of the transistor 403. In addition, when the transistor 403 is turned on, the voltage of the first capacitor electrode of the capacitor 405 is changed depending on the resistance value of a channel of the transistor 403. Moreover, the voltage of the second capacitor electrode of the capacitor 405 is changed depending on the change of the voltage of the first capacitor electrode because of the capacitive coupling, so that the gate voltage of the transistor 104 is changed. Consequently, the resistance value of the channel of the transistor 104 is changed depending on the gate voltage of the transistor 104 and the transistor 104 is turned on, so that the resonance frequency is changed.

Then, when a voltage with which an element is not broken is supplied by receiving an electric wave by the antenna 101, the voltage of the first capacitor electrode of the capacitor 405 is changed and the transistor 403 is turned off, so that the gate voltage of the transistor 104 is returned to the normal value. At this time, the gate voltage of the transistor 104 is reset to the reference value by the electronic element 404 serving as a load.

The above is the description of the operation example of the semiconductor device shown in FIG. 5A.

As described with reference to FIGS. 5A and 5B, in an example of the semiconductor device in this embodiment, whether the passive element forms the resonance circuit with another element or not is controlled by controlling an on state or an off state of the control transistor, whereby the resonance frequency of the semiconductor device can be changed as appropriate. Consequently, for example, in the case where the resonance frequency of the semiconductor device differs from a desired value when the semiconductor device is manufactured, the resonance frequency can be adjusted to be a desired value.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. In the memory circuit including the transistor with low off-state current, data (voltage) that is held does not change semipermanently. In other words, the memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

In an example of the semiconductor device in this embodiment, when a voltage with which an element might be broken is applied, resonance frequency is changed by utilizing a capacitor, and then the resonance frequency can be returned to a voltage that is previously set when a voltage with which an element is not broken is supplied. Therefore, a circuit including the passive element and the control transistor can function as a protection circuit, and the reliability of the semiconductor device can be improved.

(Embodiment 5)

In this embodiment, examples of a transistor including an oxide semiconductor layer which can be used for the semiconductor device in the above embodiment will be described.

Structural examples of the transistor including the oxide semiconductor layer will be described with reference to FIGS. 6A to 6D. FIGS. 6A to 6D are schematic cross-sectional views each showing the structural example of the transistor in this embodiment.

Figure 6A:
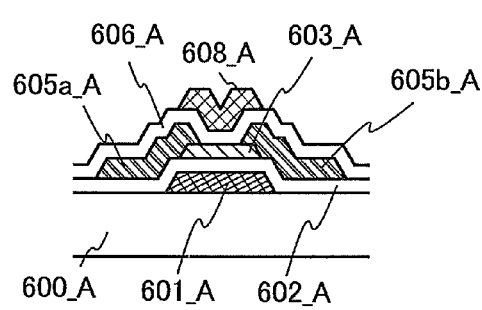
FIGS. 6A to 6D are schematic cross-sectional views showing structural examples of a transistor.

A transistor shown in FIG. 6A includes a conductive layer 601_A, an insulating layer 602_A, a semiconductor layer 603_A, a conductive layer 605a_A, a conductive layer 605b_A, an insulating layer 606_A, and a conductive layer 608_A.

The conductive layer 601_A is provided over an element formation layer 600_A.

The insulating layer 602_A is provided over the conductive layer 601_A.

The semiconductor layer 603_A overlaps with the conductive layer 601_A with the insulating layer 602_A provided therebetween.

The conductive layer 605a_A and the conductive layer 605b_A are each provided over the semiconductor layer 603_A and electrically connected to the semiconductor layer 603_A.

The insulating layer 606_A is provided over the semiconductor layer 603_A, the conductive layer 605a_A, and the conductive layer 605b_A.

The conductive layer 608_A overlaps with the semiconductor layer 603_A with the insulating layer 606_A provided therebetween.

Note that one of the conductive layer 601_A and the conductive layer 608_A is not necessarily provided. In the case where the conductive layer 608_A is not provided, the insulating layer 606_A is not necessarily provided.

Figure 6B:
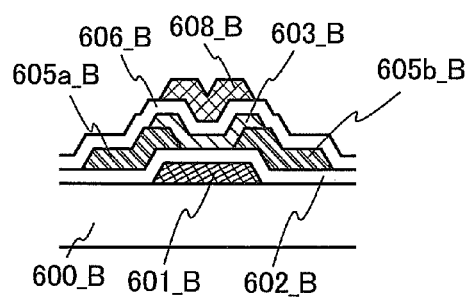

A transistor shown in FIG. 6B includes a conductive layer 601_B, an insulating layer 602_B, a semiconductor layer 603_B, a conductive layer 605a_B, a conductive layer 605b_B, an insulating layer 606_B, and a conductive layer 608_B.

The conductive layer 601_B is provided over an element formation layer 600_B.

The insulating layer 602_B is provided over the conductive layer 601_B.

The conductive layer 605a_B and the conductive layer 605b_B are each provided over part of the insulating layer 602_B.

The semiconductor layer 603_B is provided over the conductive layer 605a_B and the conductive layer 605b_B and electrically connected to the conductive layer 605a_B and the conductive layer 605b_B. Further, the semiconductor layer 603_B overlaps with the conductive layer 601_B with the insulating layer 602_B provided therebetween.

The insulating layer 606_B is provided over the semiconductor layer 603_B, the conductive layer 605a_B, and the conductive layer 605b_B.

The conductive layer 608_B overlaps with the semiconductor layer 603_B with the insulating layer 606_B provided therebetween.

Note that one of the conductive layer 601_B and the conductive layer 608_B is not necessarily provided. In the case where the conductive layer 608_B is not provided, the insulating layer 606_B is not necessarily provided.

Figure 6C:
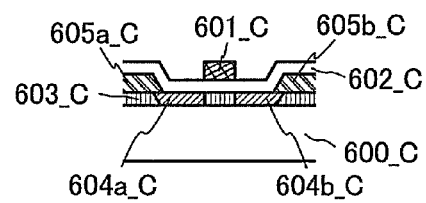

A transistor shown in FIG. 6C includes a conductive layer 601_C, an insulating layer 602_C, a semiconductor layer 603_C, a conductive layer 605a_C, and a conductive layer 605b_C.

The semiconductor layer 603_C includes a region 604a_C and a region 604b_C. The region 604a_C and the region 604b_C are separated from each other and a dopant is added to each of the regions. A region between the region 604a_C and the region 604b_C serves as a channel formation region. The semiconductor layer 603_C is provided over an element formation layer 600_C.

The conductive layer 605a_C and the conductive layer 605b_C are provided over the semiconductor layer 603_C and electrically connected to the semiconductor layer 603_C.

Side surfaces of the conductive layer 605a_C and the conductive layer 605b_C are tapered.

The conductive layer 605a_C overlaps with part of the region 604a_C; however, the present invention is not necessarily limited to this. When the conductive layer 605a_C partly overlaps with the region 604a_C, resistance between the conductive layer 605a_C and the region 604a_C can be low. Further, an entire region in the semiconductor layer 603_C, which overlaps with the conductive layer 605a_C may be the region 604a_C.

The conductive layer 605b_C overlaps with part of the region 604b_C; however, the present invention is not limited to this. When the conductive layer 605b_C partly overlaps with the region 604b_C, resistance between the conductive layer 605b_C and the region 604b_C can be low. Further, an entire region in the semiconductor layer 603_C, which overlaps with the conductive layer 605b_C may be the region 604b_C.

The insulating layer 602_C is provided over the semiconductor layer 603_C, the conductive layer 605a_C, and the conductive layer 605b_C.

The conductive layer 601_C overlaps with the semiconductor layer 603_C with the insulating layer 602_C provided therebetween. A region in the semiconductor layer 603_C, which overlaps with the conductive layer 601_C with the insulating layer 602_C provided therebetween serves as the channel formation region.

Figure 6D:
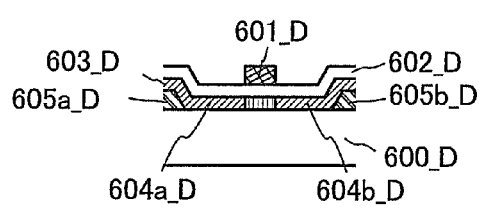

A transistor shown in FIG. 6D includes a conductive layer 601_D, an insulating layer 602_D, a semiconductor layer 603_D, a conductive layer 605a_D, and a conductive layer 605b_D.

The conductive layer 605a_D and the conductive layer 605b_D are provided over an element formation layer 600_D. Side surfaces of the conductive layer 605a_D and the conductive layer 605b_D are tapered.

The semiconductor layer 603_D includes a region 604a_D and a region 604b_D. The region 604a_D and the region 604b_D are separated from each other and a dopant is added to each of the regions. A region between the region 604a_D and the region 604b_D serves as a channel formation region. The semiconductor layer 603_D is provided over the conductive layer 605a_D, the conductive layer 605b_D, and the element formation layer 600_D and electrically connected to the conductive layer 605a_D and the conductive layer 605b_D.

The region 604a_D is electrically connected to the conductive layer 605a_D.

The region 604b_D is electrically connected to the conductive layer 605b_D.

The insulating layer 602_D is provided over the semiconductor layer 603_D.

The conductive layer 601_D overlaps with the semiconductor layer 603_D with the insulating layer 602_D provided therebetween. A region in the semiconductor layer 603_D, which overlaps with the conductive layer 601_D with the insulating layer 602_D provided therebetween serves as the channel formation region.

Next, the components shown in FIGS. 6A to 6D will be described.

As the element formation layers 600_A to 600_D, insulating layers, substrates having insulating surfaces, or the like can be used, for example. Further, layers over which elements are formed in advance can be used as the element formation layers 600_A to 600_D.

Each of the conductive layers 601_A to 601_D has a function of a gate of the transistor. Note that a layer having a function of a gate of the transistor can be called a gate electrode or a gate wiring.

As the conductive layers 601_A to 601_D, a layer of a metal material such as molybdenum, titanium, chromium, tantalum, tungsten, aluminum, copper, neodymium, or scandium or an alloy material containing any of these materials as a main component can be used, for example. Alternatively, the conductive layers 601_A to 601_D can be formed by stacking layers of materials that can be used for the conductive layers 601_A to 601_D.

Each of the insulating layers 602_A to 602_D has a function of a gate insulating layer of the transistor.

Each of the insulating layers 602_A to 602_D can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer. Each of the insulating layers 602_A to 602_D can be a stack of layers of a material that can be used for the insulating layers 602_A to 602_D.

Alternatively, the insulating layers 602_A to 602_D, an insulating layer of a material containing, for example, an element that belongs to Group 13 in the periodic table and oxygen can be used. When the semiconductor layers 603_A to 603_D contain an element that belongs to Group 13, the use of insulating layers each containing an element that belongs to Group 13 as insulating layers in contact with the semiconductor layers 603_A to 603_D makes the state of interfaces between the insulating layers and the oxide semiconductor layers favorable.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. As the insulating layers 602_A to 602_D, a material represented by $Al_2O_x$ (x=3+α, where α is larger than 0 and smaller than 1), $Ga_2O_x$ (x=3+α, where α is larger than 0 and smaller than 1), or $Ga_xAl_{2-x}O_{3+α}$ (x is larger than 0 and smaller than 2 and α is larger than 0 and smaller than 1) can be used, for example.

Each of the insulating layers 602_A to 602_D can be a stack of layers of a material which can be used for the insulating layers 602_A to 602_D. For example, the insulating layers 602_A to 602_D can be a stack of layers containing gallium oxide represented by $Ga_2O_x$. Alternatively, the insulating layers 602_A to 602_D may be a stack of layers of an insulating layer containing gallium oxide represented by $Ga_2O_x$ and an insulating layer containing aluminum oxide represented by $Al_2O_x$.

Each of the oxide semiconductor layers 603_A to 603_D functions as a layer in which a channel of the transistor is formed. An oxide semiconductor used for the semiconductor layers 603_A to 603_D preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide; a tin oxide; a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" refers to an oxide containing In, Ga, and Zn as its main component and there is no particular limitation on the ratio of In:Ga:Zn. The In—Ga—Zn-based oxide may contain a metal element other than In, Ga, and Zn.

A material represented by $InMO_3(ZnO)_m$ (m>0 is satisfied, and m is not an integer) may be used as an oxide semiconductor. Note that M represents one or more metal elements selected from Ga, Fe, Mn, and Co. As the oxide semiconductor, a material expressed by a chemical formula, $In_3SnO_5(ZnO)_n$ (n>0, n is an integer) may be used.

For another example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, Ra is obtained by three-dimension expansion of center line average roughness that is defined by JIS B 0601 so as to be applied to a plane. The Ra can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 2]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM). The measurement plane is a plane where all the measurement data are shown, and the measurement data consists of three parameters (x, y, z) and is represented by z=f(x,y).

Here, an oxide including a crystal with c-axis alignment, which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such a crystal is also referred to as a c-axis aligned crystal (CAAC).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The oxide including CAAC is not a single crystal, but this does not mean that the oxide including CAAC is composed of only an amorphous component. Although the oxide film including CAAC includes a crystallized portion (crystalline portion), a boundary between one crystalline portion and another crystalline portion is not clear in some cases.

Nitrogen may be substituted for part of oxygen included in the oxide including CAAC. The c-axes of individual crystalline portions included in the oxide including CAAC may be aligned in a certain direction (e.g., a direction perpendicular to a surface of a substrate over which the oxide including CAAC is formed or a surface of the oxide including CAAC). Alternatively, the normals of the a-b planes of the individual crystalline portions included in the oxide including CAAC may be aligned in a certain direction (e.g., a direction perpendicular to a surface of a substrate over which the oxide including CAAC is formed or a surface of the oxide including CAAC).

The oxide including CAAC becomes a conductor, a semiconductor, or an insulator depending on its composition or the like. The oxide including CAAC transmits or does not transmit visible light depending on its composition or the like.

An example of such an oxide including CAAC is an oxide which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure included in the oxide including CAAC will be described in detail with reference to FIGS. 10A to 10E, FIGS. 11A to 11C, and FIGS. 12A to 12C. In FIGS. 10A to 10E, FIGS. 11A to 11C, and FIGS. 12A to 12C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 10A:
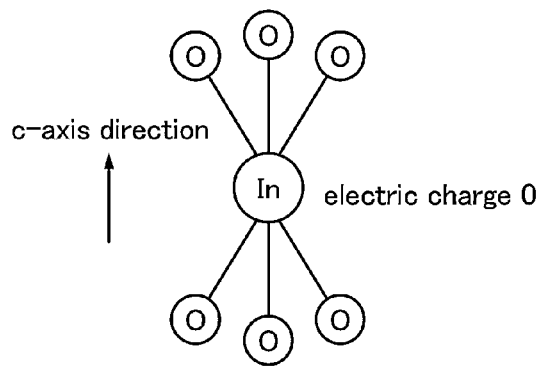
FIGS. 10A to 10E show structures of an oxide material.

FIG. 10A shows a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 10A is actually an octahedral structure, but is shown as a planar structure for simplicity. Note that three tetracoordinate O atoms exist in each of an upper half and a lower half in FIG. 10A. In the small group shown in FIG. 10A, electric charge is 0.

Figure 10D:
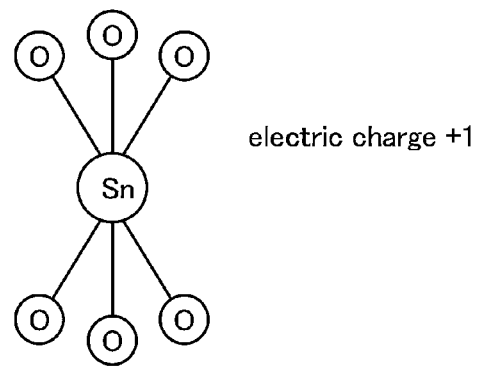
Figure 10B:
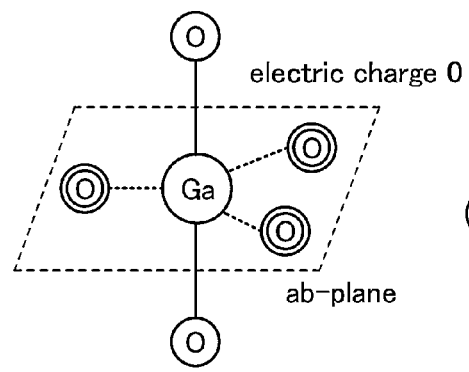

FIG. 10B shows a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 10B. An In atom can also have the structure shown in FIG. 10B because an In atom can have five ligands. In the small group shown in FIG. 10B, electric charge is 0.

Figure 10E:
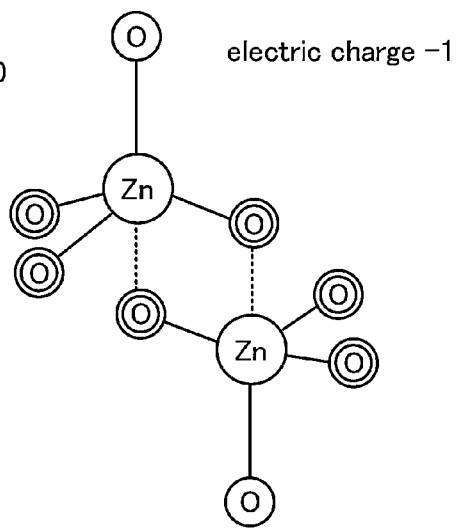
Figure 10C:
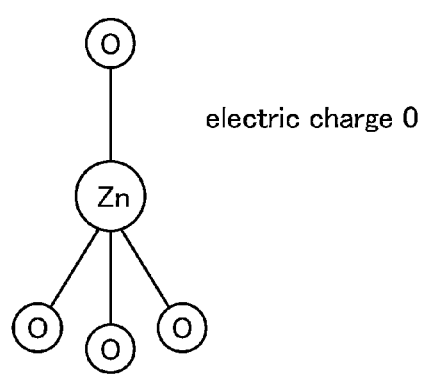

FIG. 10C shows a structure including one tetracoordinate Zn atom and four tetracoordinate O atoms proximate to the Zn atom. In FIG. 10C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 10C. In the small group shown in FIG. 10C, electric charge is 0.

FIG. 10D shows a structure including one hexacoordinate Sn atom and six tetracoordinate O atoms proximate to the Sn atom. In FIG. 10D, three tetracoordinate O atoms exist in each of an upper half and a lower half. In the small group shown in FIG. 10D, electric charge is +1.

FIG. 10E shows a small group including two Zn atoms. In FIG. 10E, one tetracoordinate O atom exists in each of an upper half and a lower half. In the small group shown in FIG. 10E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 10A each have three proximate In atoms in the downward direction, and the three O atoms in the lower half each have three proximate In atoms in the upward direction. The one O atom in the upper half with respect to the pentacoordinate Ga atom in FIG. 10B has one proximate Ga atom in the downward direction, and the one O atom in the lower half has one proximate Ga atom in the upward direction. The one O atom in the upper half with respect to the tetracoordinate Zn atom in FIG. 10C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Therefore, when the sum of the number of tetracoordinate O atoms above a metal atom and the number of tetracoordinate O atoms below another metal atom is four, the two kinds of small groups including the metal atoms can be bonded. The reason will be described hereinafter. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

FIG. 11A shows a model of a medium group included in a layered structure of an In—Sn—Zn—O-based material. FIG. 11B shows a large group including three medium groups. Note that FIG. 11C shows an atomic arrangement in the case where the layered structure in FIG. 11B is observed from the c-axis direction.

In FIG. 11A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also shows a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 11A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as shown in FIG. 10E is given. For example, with one small group including two Zn atoms, electric charge of one small group including a Sn atom can be cancelled, so that the total electric charge of the layered structure can be 0.

When the large group shown in FIG. 11B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). The In—Sn—Zn—O-based crystal is preferable because the crystallinity of the In—Sn—Zn—O-based crystal can be improved by increasing the number of m.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide, such as an In-based oxide, a Sn-based oxide, or a Zn-based oxide; and the like.

Figures 12A, 12B, 12C:
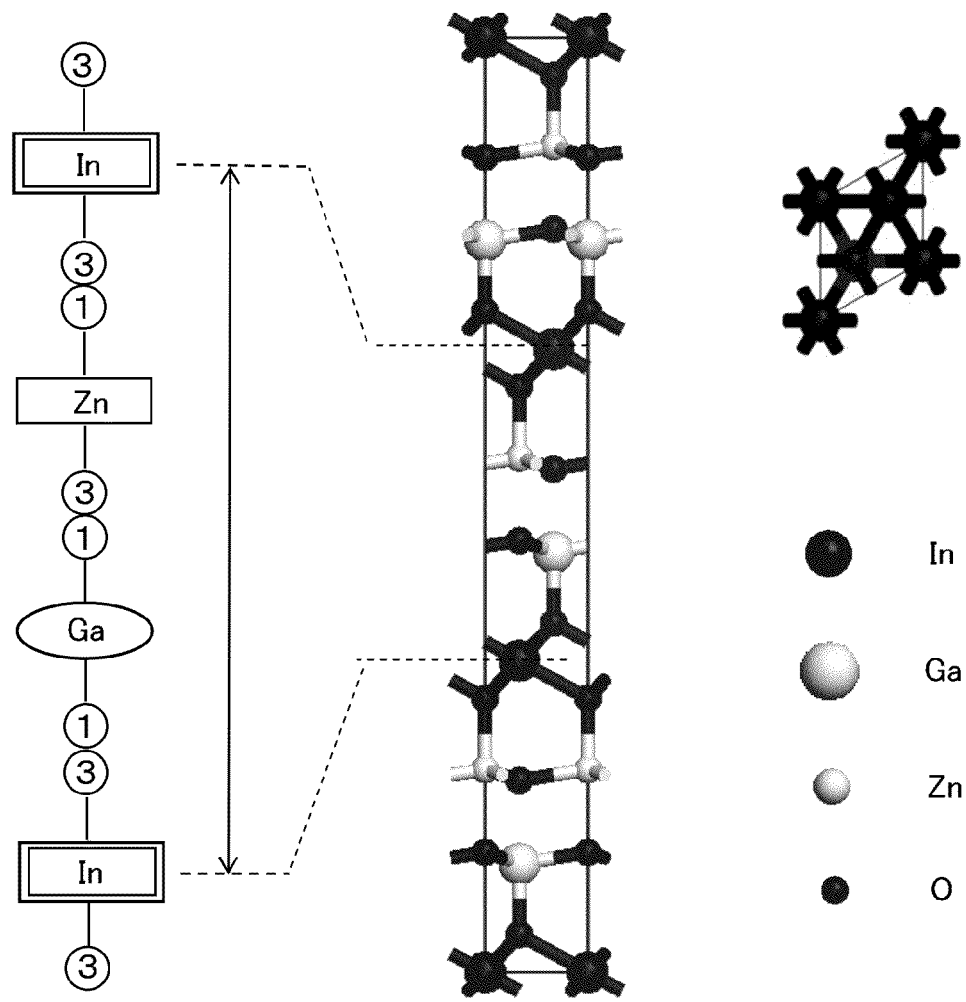
FIGS. 12A to 12C show a structure of an oxide material.

As an example, FIG. 12A shows a model of a medium group included in a layered structure of an In—Ga—Zn—O-based material.

In the medium group included in the layered structure of the In—Ga—Zn—O-based material in FIG. 12A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded to form a large group.

FIG. 12B shows a large group including three medium groups. Note that FIG. 12C shows an atomic arrangement in the case where the layered structure in FIG. 12B is observed from the c-axis direction.

Here, since electric charge of a hexacoordinate or pentacoordinate In atom, electric charge of a tetracoordinate Zn atom, and electric charge of a pentacoordinate Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group shown in FIG. 12A but also a medium group in which the arrangement of the In atom, the Ga atom, and the Zn atom is different from that in FIG. 12A.

A dopant imparting n-type or p-type conductivity is added to each of the region 604a_C, the region 604b_C, the region 604a_D, and the region 604b_D, and the region 604a_C, the region 604b_C, the region 604a_D, and the region 604b_D each function as a source or a drain of the transistor. Note that a region functioning as the source of the transistor is also referred to as a source region, and a region functioning as the drain of the transistor is also referred to as a drain region.

The conductive layers 605a_A to 605a_D and the conductive layers 605b_A to 605b_D function as the source or the drain of the transistor. Note that a layer functioning as a source of the transistor is also referred to as a source electrode or a source wiring, and a layer functioning as a drain of the transistor is also referred to as a drain electrode or a drain wiring.

Each of the conductive layers 605a_A to 605a_D and the conductive layers 605b_A to 605b_D can be formed using, for example, a layer of a metal material such as aluminum, magnesium, chromium, copper, tantalum, titanium, molybdenum, or tungsten; or an alloy material which contains any of the above metal materials as a main component. For example, each of the conductive layers 605a_A to 605a_D and the conductive layers 605b_A to 605b_D can be formed using a layer of an alloy material containing copper, magnesium, and aluminum. Alternatively, each of the conductive layers 605a_A to 605a_D and the conductive layers 605b_A to 605b_D can be formed using a stacked-layer structure of layers that can be used for the conductive layers 605a_A to 605a_D and the conductive layers 605b_A to 605b_D. For example, each of the conductive layers 605a_A to 605a_D and the conductive layers 605b_A to 605b_D can be formed using a stacked-layer structure including a layer of an alloy material containing copper, magnesium, and aluminum and a layer containing copper.

Further, layer containing a conductive metal oxide can be used for each of the conductive layers 605a_A to 605a_D and the conductive layers 605b_A to 605b_D. Examples of the conductive metal oxide include indium oxide, tin oxide, zinc oxide, indium oxide-tin oxide, and indium oxide-zinc oxide. Note that the conductive metal oxide that can be used for each of the conductive layers 605a_A to 605a_D and the conductive layers 605b_A to 605b_D may contain silicon oxide.

For each of the insulating layers 606_A and 606_B, a layer of a material that can be used for the insulating layers 602_A to 602_D can be used. Alternatively, each of the insulating layers 606_A and 606_B can be formed using a stacked-layer structure of a material that can be used for the insulating layers 606_A and 606_B. For example, each of the insulating layers 606_A and 606_B may be formed using a silicon oxide layer, an aluminum oxide layer, or the like.

Each of the conductive layers 608_A and 608_B functions as a gate of the transistor. Note that in the case where the transistor includes both the conductive layers 601_A and 608_A or both the conductive layers 601_B and 608_B, one of the conductive layers 601_A and 608_A or one of the conductive layers 601_B and 608_B is referred to as a back gate, a back gate electrode, or a back gate wiring. A plurality of conductive layers each functioning as a gate is provided with the channel formation layer provided therebetween, whereby the threshold voltage of the transistor can be easily controlled.

As each of the conductive layers 608_A and 608_B, a layer of a material that can be used for the conductive layers 601_A to 601_D can be used, for example. Each of the conductive layers 608_A and 608_B may be formed using a stacked-layer structure of a material that can be used for the conductive layers 608_A and 608_B.

Note that the transistor of this embodiment may have a structure in which an insulating layer is provided over part of the oxide semiconductor layer functioning as a channel formation layer and a conductive layer functioning as a source or a drain is provided to overlap with the oxide semiconductor layer with the insulating layer interposed therebetween. Consequently, the insulating layer functions as a layer protecting the channel formation layer (also referred to as a channel protective layer) of the transistor. As the insulating layer functioning as a channel protective layer, a layer including a material that can be used for the insulating layers 602_A to 602_D can be used for example. Alternatively, an insulating layer functioning as a channel protective layer may be formed by stacking layers of materials that can be used for the insulating layers 602_A to 602_D.

Next, as an example of a method for manufacturing the transistor in this embodiment, an example of a method for manufacturing the transistor shown in FIG. 6A will be described with reference to FIGS. 7A to 7E. FIGS. 7A to 7E are schematic cross-sectional views showing an example of the method for manufacturing the transistor in FIG. 6A.

Figure 7A:
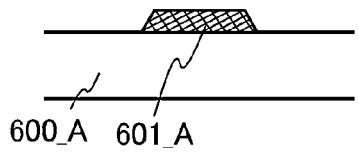
FIGS. 7A to 7E are schematic cross-sectional views showing an example of a method for manufacturing a transistor.

First, as shown in FIG. 7A, the element formation layer 600_A is prepared, a first conductive film is formed over the element formation layer 600_A, and part of the first conductive film is etched to form the conductive layer 601_A.

A film of a material that can be used for the conductive layer 601_A is formed by a sputtering method, so that the first conductive film can be formed, for example. The first conductive film can be formed by stacking layers each formed of a material that can be used for the first conductive film.

When a high-purity gas from which an impurity such as hydrogen, water, a hydroxyl group, or a hydride are removed is used as a sputtering gas, the impurity concentration of a film to be formed can be reduced.

Note that before the film is formed by a sputtering method, preheat treatment may be performed in a preheating chamber of a sputtering apparatus. With the preheat treatment, an impurity such as hydrogen or moisture can be eliminated.

Further, before the film is formed by a sputtering method, it is possible to perform the following treatment (called reverse sputtering): instead of applying a voltage to the target side, an RF power source is used for applying a voltage to the substrate side in an argon, nitrogen, helium, or oxygen atmosphere so that plasma is generated to modify a surface where the film is to be formed. With reverse sputtering, powdery substances (also referred to as particles or dust) attached to the surface where the film is to be formed can be removed.

In the case where the film is formed by a sputtering method, moisture remaining in a deposition chamber used for forming the film can be removed with an entrapment vacuum pump or the like. As the entrapment vacuum pump, a cryopump, an ion pump, or a titanium sublimation pump can be used, for example. Moisture remaining in the deposition chamber can be removed with a turbo pump provided with a cold trap.

As a method for forming the conductive layer 601_A, the example of a method for manufacturing the transistor of this embodiment employs, for example, the following steps in order to form a layer by etching part of a film: a resist mask is formed over part of the film by a photolithography process and the film is etched using the resist mask, thereby forming the layer. Note that in this case, the resist mask is removed after the layer is formed.

Note that the resist mask may be formed by an inkjet method. A photomask is not used in an inkjet method; thus, manufacturing cost can be reduced. Alternatively, the resist mask may be formed using a light-exposure mask having a plurality of regions with different transmittances (also referred to as a multi-tone mask). With the use of the multi-tone mask, a resist mask having different thicknesses can be formed, and the number of resist masks used for manufacturing the transistor can be reduced.

Figure 7B:
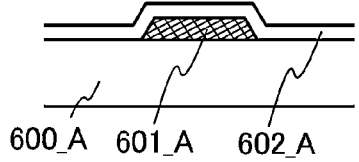

Next, as shown in FIG. 7B, a first insulating film is formed over the conductive layer 601_A, so that the insulating layer 602_A is formed.

For example, a film of a material that can be used for the insulating layer 602_A is formed by sputtering, plasma CVD, or the like, so that the first insulating film can be formed. Alternatively, the first insulating film can be formed by a stack of layers of materials that can be used for the insulating layer 602_A. Further, when the film formed using a material that can be used for the insulating layer 602_A is formed by a high-density plasma-enhanced CVD method (e.g., a high-density plasma-enhanced CVD method using microwaves (e.g., microwaves with a frequency of 2.45 GHz)), the insulating layer 602_A can be dense and can have higher breakdown voltage.

Figure 7C:
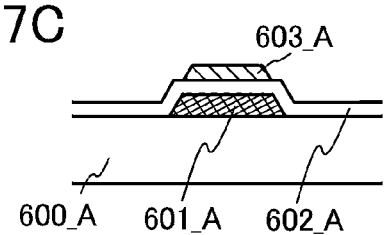

Next, an oxide semiconductor film is formed over the insulating layer 602_A and then part of the oxide semiconductor film is etched, whereby the oxide semiconductor layer 603_A is formed as shown in FIG. 7C.

For example, a film of an oxide semiconductor material that can be used for the semiconductor layer 603_A is formed by a sputtering method, so that the oxide semiconductor film can be formed. Note that the oxide semiconductor film may be formed in a rare gas atmosphere, an oxygen atmosphere, or a mixed atmosphere of a rare gas and oxygen.

The oxide semiconductor film can be formed using an oxide target having a composition ratio: $In_2O_3:Ga_2O_3:ZnO=1:1:1$ in molar ratio as a sputtering target. The oxide semiconductor film may be formed using an oxide target having a composition ratio: $In_2O_3:Ga_2O_3:ZnO=1:1:2$ in molar ratio.

In addition, as the sputtering target, an In—Sn—Zn-based oxide target having a composition ratio: In:Sn:Zn=1:2:2, 2:1:3, 1:1:1, 20:45:35, or the like in an atomic ratio may be used.

Figure 7D:
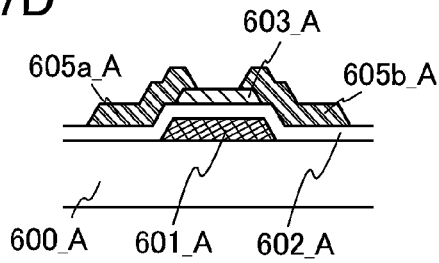

Next, as shown in FIG. 7D, a second conductive film is formed over the insulating layer 602_A and the semiconductor layer 603_A and is partly etched, so that the conductive layer 605a_A and the conductive layer 605b_A are formed.

For example, a material that can be used for the conductive layer 605a_A and the conductive layer 605b_A is formed by sputtering or the like, whereby the second conductive film can be formed. Alternatively, the second conductive film can be formed by stacking films formed using materials that can be used for the conductive layer 605a_A and the conductive layer 605b_A.

Figure 7E:
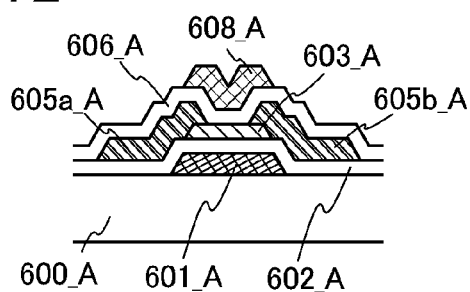

Next, as shown in FIG. 7E, the insulating layer 606_A is formed to be in contact with the semiconductor layer 603_A.

For example, a film that can be used as the insulating layer 606_A is formed in a rare gas (typically, argon) atmosphere, an oxygen atmosphere, or a mixed atmosphere of a rare gas and oxygen by a sputtering method, whereby the insulating film 606_A. Forming the insulating layer 606_A by a sputtering method can suppress the decrease in the resistance value of part of the semiconductor layer 603_A that functions as a back channel of the transistor. The temperature of the substrate at the time when the insulating layer 606_A is formed is preferably higher than or equal to room temperature and lower than or equal to 300° C.

Before formation of the insulating layer 606_A, plasma treatment with the use of a gas of $N_2O$, $N_2$, Ar, or the like may be performed to remove water or the like adsorbed on an exposed surface of the semiconductor layer 603_A. In the case of performing the plasma treatment, the insulating layer 606_A is preferably formed after the plasma treatment without exposure to air.

Further, in the example of the method for manufacturing the transistor in FIG. 6A, heat treatment is performed, for example, at higher than or equal to 600° C. and lower than or equal to 750° C., or higher than or equal to 600° C. lower than the strain point of the substrate. For example, the heat treatment is performed after the oxide semiconductor film is formed, after part of the oxide semiconductor film is etched, after the second conductive film is formed, after part of the second conductive film is etched, or after the insulating layer 606_A is formed.

Note that a heat treatment apparatus for the heat treatment can be an electric furnace or an apparatus for heating an object by heat conduction or heat radiation from a heater such as a resistance heater. For example, a rapid thermal anneal (RTA) apparatus such as a gas rapid thermal anneal (GRTA) apparatus, or a lamp rapid thermal anneal (LRTA) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the above heat treatment. It is preferable that the oxygen gas or the $N_2O$ gas do not contain water, hydrogen, and the like. The purity of the oxygen gas or the $N_2O$ gas which is introduced into the heat treatment apparatus is preferably greater than or equal to 6N, more preferably greater than or equal to 7N (i.e., the impurity concentration of the oxygen gas or the $N_2O$ gas is preferably less than or equal to 1 ppm, more preferably less than or equal to 0.1 ppm). By the action of the oxygen gas or the $N_2O$ gas, oxygen is supplied to the semiconductor layer 603_A, so that defects caused by oxygen deficiency in the semiconductor layer 603_A can be reduced.

Further, in addition to the heat treatment, after the insulating layer 606_A is formed, heat treatment (preferably at higher than or equal to 200° C. and lower than or equal to 600° C., for example, higher than or equal to 250° C. and lower than or equal to 350° C.) may be performed in an inert gas atmosphere or an oxygen gas atmosphere.

Oxygen doping using oxygen plasma may be performed after the insulating layer 602_A is formed, after the oxide semiconductor film is formed, after the conductive layers serving as the source electrode and the drain electrode are formed, after the insulating layer over the conductive layers serving as the source electrode and the drain electrode is formed, or after the heat treatment is performed. For example, an oxygen doping treatment using a high-density plasma of 2.45 GHz may be performed. Alternatively, oxygen doping treatment may be performed by an ion implantation method or ion doping. The oxygen doping can reduce variations in electrical characteristics of transistors which are manufactured. For example, by performing oxygen doping, one of or both the insulating layer 602_A and the insulating layer 606_A have oxygen having higher proportion than that in the stoichiometric composition. Consequently, excess oxygen in the insulating layer is likely to be supplied to the semiconductor layer 603_A. As a result, an oxygen defect in the semiconductor layer 603_A or at an interface between the semiconductor layer 603_A and one of or both the insulating layer 602_A and the insulating layer 606_A can be reduced, which results in further reduction in the carrier concentration in the semiconductor layer 603_A.

For example, when an insulating layer containing gallium oxide is formed as one or each of the insulating layer 602_A and the insulating layer 606_A, the composition of the gallium oxide can be set to be $Ga_2O_x$ by supplying the insulating layer with oxygen.

Alternatively, when an insulating layer containing aluminum oxide is formed as one or each of the insulating layer 602_A and the insulating layer 606_A, the composition of the aluminum oxide can be set to be $Al_2O_x$ by supplying the insulating layer with oxygen.

Further, when an insulating layer containing gallium aluminum oxide or aluminum gallium oxide is formed as one or each of the insulating layer 602_A and the insulating layer 606_A, the composition of the gallium aluminum oxide or the aluminum gallium oxide can be set to be $Ga_xAl_{2-x}O_{3+\alpha}$ by supplying the insulating layer with oxygen.

Through the above steps, an impurity such as hydrogen, water, a hydroxyl group, or hydride (also referred to as a hydrogen compound) is removed from the semiconductor layer 603_A and oxygen is supplied to the semiconductor layer 603_A; thus, the oxide semiconductor layer can be highly purified.

Moreover, as shown in FIG. 7E, a third conductive film is formed over the insulating layer 606_A and part of the third conductive film is etched, whereby the conductive layer 608_A is formed.

For example, a film formed using a material that can be used for the conductive layer 608_A is formed by a sputtering method, whereby the third conductive film can be formed. The third conductive film can be formed by stacking layers formed of materials that can be used for the third conductive film.

Note that although the example of the method for manufacturing the transistor shown in FIG. 6A is described, this embodiment is not limited to this. For example, as for the components in FIGS. 6B to 6D that have the same designations as the components in FIG. 6A and whose functions are at least partly the same as those of the components in FIG. 6A, the description of the example of the method for manufacturing the transistor shown in FIG. 6A can be referred to as appropriate.

In the case where the regions 604*a*_C and 604*a*_D or the regions 604*b*_C and 604*b*_D are formed as shown in FIG. 6C or FIG. 6D, the regions 604*a*_C and 604*a*_D or the regions 604*b*_C and 604*b*_D are formed in a self-aligned manner by adding a dopant to a semiconductor layer from a side where a conductive layer serving as a gate is formed with an insulating layer serving as a gate insulating layer provided therebetween.

For example, the dopant can be added with the use of an ion doping apparatus or an ion implantation apparatus.

As the dopants which is added, for example, one or more of elements of Group 13 in the periodic table (e.g., boron), of Group 15 in the periodic table (e.g., one or more of nitrogen, phosphorus, and arsenic), and of rare gas (e.g., one or more of helium, argon, and xenon) can be used.

As described with FIGS. 6A to 6D and FIGS. 7A to 7E, examples of the transistor in this embodiment each include the conductive layer serving as the gate; the insulating layer serving as the gate insulating layer; the oxide semiconductor layer which overlaps with the conductive layer serving as the gate with the insulating layer serving as the gate insulating layer provided therebetween and in which a channel is formed; the conductive layer which is electrically connected to the oxide semiconductor layer and serves as one of the source and the drain; and the conductive layer which is electrically connected to the oxide semiconductor layer and serves as the other of the source and the drain.

The oxide semiconductor layer in which a channel is formed is an oxide semiconductor layer which is made an i-type or substantially i-type by being purified. With the purified oxide semiconductor layer, the carrier concentration of the oxide semiconductor layer can be lower than $1 \times 10^{14}/\text{cm}^3$, preferably lower than $1 \times 10^{12}/\text{cm}^3$, further preferably lower than $1 \times 10^{11}/\text{cm}^3$. With the above structure, the off-state current per micrometer of the channel width can be lower than or equal to 10 aA ($1 \times 10^{-17}$ A), lower than or equal to 1 aA ($1 \times 10^{-18}$ A), lower than or equal to 10 zA ($1 \times 10^{-20}$ A), further lower than or equal to 1 zA ($1 \times 10^{-21}$ A), and furthermore lower than or equal to 100 yA ($1 \times 10^{-22}$ A). It is preferable that the off-state current of the transistor be as low as possible. The lowest value of the off-state current of the transistor in this embodiment is estimated to be about $10^{-30}$ A/µm.

With the use of the transistor including the oxide semiconductor layer in this embodiment as the transistor of the memory circuit in the semiconductor device of the above embodiment, the memory circuit that is less likely to deteriorate can be formed. In addition, a data holding period of the memory circuit can be longer.

(Embodiment 6)

In this embodiment, an example of a semiconductor device which can wirelessly communicate data, such as an RFID, will be described.

Figure 8:
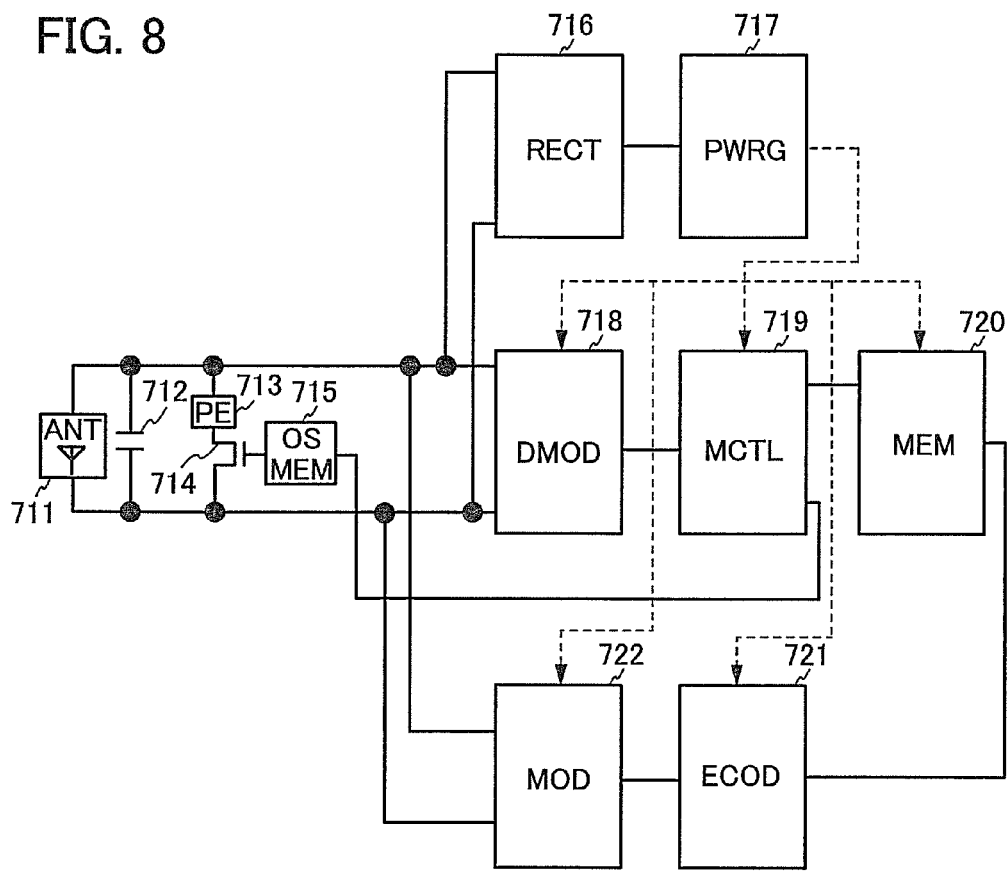
FIG. 8 shows an example of a semiconductor device.

A structural example of the semiconductor device in this embodiment will be described with reference to FIG. 8. FIG. 8 is a block diagram showing the structural example of the semiconductor device in this embodiment.

The semiconductor device shown in FIG. 8 includes an antenna 711, a capacitor 712, a passive element 713, a transistor 714, a memory circuit 715, a rectifier circuit 716, a power supply circuit (also referred to as PWRG) 717, a demodulation circuit (also referred to as DMOD) 718, a memory control circuit (also referred to as MCTL) 719, a memory (also referred to as MEM) 720, an encoding circuit (also referred to as ECOD) 721, and a modulation circuit (also referred to as MOD) 722. The semiconductor device in FIG. 8 transmits and receives a wireless signal to and from an external circuit such as a wireless communication device (a device capable of wireless communication, such as a reader/writer or an interrogator) through the antenna 711.

The antenna 711 has a function of transmitting and receiving a carrier wave. As the antenna 711, the antenna 101 shown in FIG. 1A can be applied and an antenna having a function of a coil can be used, for example.

The carrier wave is an alternate-current signal which is also referred to as a carrier. With the carrier wave, a power supply voltage is supplied or data signal communication is performed. Note that a carrier wave externally transmitted to the antenna 711 includes a modulated carrier wave (a modulated wave).

The capacitor 712 is electrically connected to the antenna 711 in parallel. Note that a switching element such as a transistor may be provided between the antenna 711 and one or both of a first capacitor electrode and a second capacitor electrode of the capacitor 712.

The passive element 713 functions as part of a resonance circuit by being electrically connected to the antenna 711 in parallel. As the passive element 713, a passive element that can be used as the passive element 103 shown in FIG. 1A can be used, for example.

The transistor 714 has a function of controlling whether the passive element 713 and the antenna 711 are electrically connected in parallel or not. For example, one of a source and a drain of the transistor 714 is connected to the other of the source and the drain of the transistor 714 through the passive element 713 and the antenna 711. As the transistor 714, a transistor that can be used as the transistor 104 shown in FIG. 1A can be used.

The memory circuit 715 has a function of holding the gate voltage of the transistor 714.

As the memory circuit 715, a memory circuit that can be used as the memory circuit 105 in the semiconductor device described in the above embodiment can be used, for example.

The rectifier circuit 716 has a function of rectifying a voltage generated by receiving an electric wave by the antenna 711.

The power supply circuit 717 has a function of generating a power supply voltage from a voltage rectified by the rectifier circuit 716. The generated power supply voltage is supplied to each of the functional circuits such as the demodulation circuit 718, the memory control circuit 719, the memory 720, the encoding circuit 721, and the modulation circuit 722 as shown by dashed lines in FIG. 8. The demodulation circuit 718, the memory control circuit 719, the memory 720, the encoding circuit 721, and the modulation circuit 722 each operate when power is supplied.

The demodulation circuit 718 has a function of demodulating a carrier wave received by the antenna 711 to extract a data signal.

The memory control circuit 719 has a function of generating an access signal such as a write control signal, a read control signal, and an address signal based on the demodulated data signal.

Data is stored in the memory 720. For example, one or both of read only memory (ROM) and random access memory (RAM) can be used as the memory 720.

The encoding circuit 721 has a function of encoding the data signal read out from the memory 720.

The modulation circuit 722 has a function of modulating the encoded data signal and generating a data signal to be transmitted as a carrier wave from the antenna 711.

Next, an operation example of the semiconductor device in FIG. 8 will be described.

When the antenna 711 receives a carrier wave, a voltage is generated depending on the received carrier wave.

The voltage generated in the antenna 711 is input to the power supply circuit 717 and the demodulation circuit 718.

The power supply circuit 717 generates a power supply voltage based on the voltage generated in the antenna 711 and outputs the generated power supply voltage to the demodulation circuit 718, the memory control circuit 719, the memory 720, the encoding circuit 721, and the modulation circuit 722.

The demodulation circuit 718 demodulates a signal of the voltage input from the antenna 711 to extract a data signal, and outputs the extracted data signal to the memory control circuit 719.

The memory control circuit 719 generates an access signal according to the data signal. The memory control circuit 719 outputs the data signal and a control signal to the memory circuit 715.

The memory 720 writes or reads data according to the access signal.

Data is written to the memory circuit 715 according to the data signal and the control signal. Note that the present invention is not limited thereto and for example, at the time when the semiconductor device is manufactured, a control signal and a data signal may be input to the memory circuit 715 so that data is written to the memory circuit 715.

The encoding circuit 721 encodes the data signal read from the memory 720.

The modulation circuit 722 modulates a carrier wave to be transmitted from the antenna 711 according to the encoded data signal.

The above is the description of the operation example of the semiconductor device shown in FIG. 8.

As described with reference to FIG. 8, the semiconductor device in this embodiment can wirelessly transmit and receive data.

In an example of the semiconductor device in this embodiment, whether the passive element forms the resonance circuit with another element or not is controlled by controlling an on state or an off state of the control transistor, whereby the resonance frequency of the semiconductor device can be changed as appropriate.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. In the memory circuit including the transistor with low off-state current, data (voltage) that is held does not change semipermanently. In other words, the memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

In an example of the semiconductor device in this embodiment, the memory control circuit controlling the operation of the memory can also control the memory circuit including the transistor with low off-state current; therefore, an additional control circuit for controlling the memory circuit including the transistor with low off-state current is unnecessary. Consequently, in the case of providing the memory circuit including the transistor with low off-state current, an increase in the area of circuits in the semiconductor device can be suppressed.

(Embodiment 7)

In this embodiment, examples of a semiconductor device capable of wirelessly supplying a power supply voltage will be described.

Figure 9A:
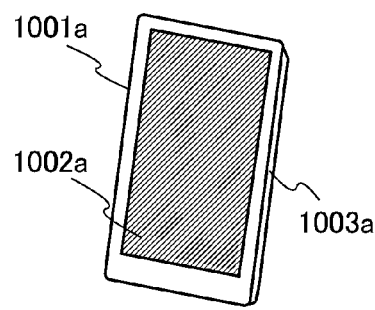
FIGS. 9A to 9C show examples of semiconductor devices.
Figure 9B:
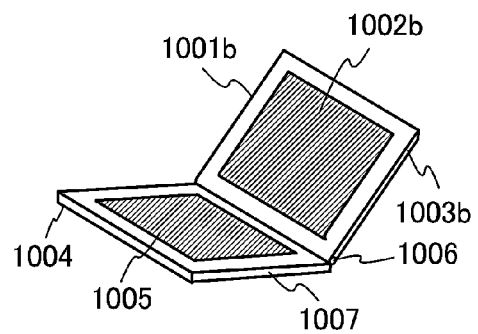
Figure 9C:
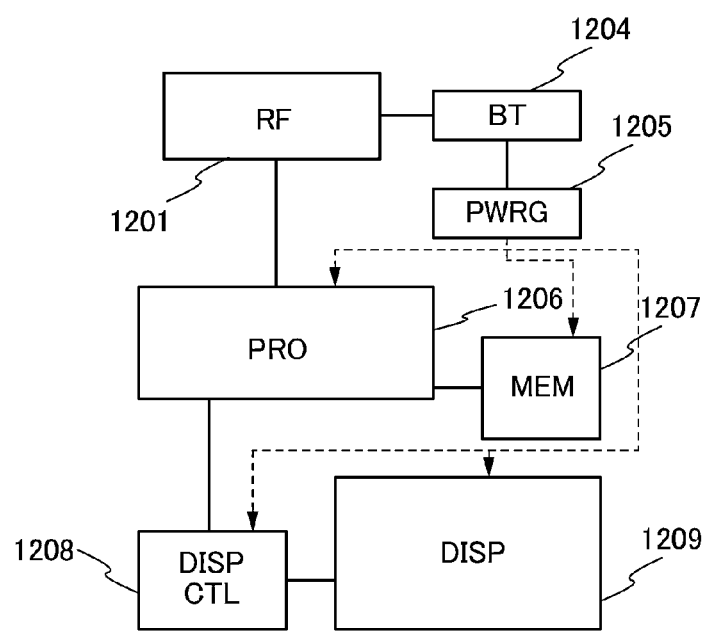

Structural examples of the semiconductor device of this embodiment will be described with reference to FIGS. 9A to 9C. FIGS. 9A to 9C are schematic views for describing the structural examples of the semiconductor devices in this embodiment.

A semiconductor device shown in FIG. 9A is an example of a portable information terminal The portable information terminal in FIG. 9A includes a housing 1001a and a display portion 1002a provided in the housing 1001a.

Note that a side surface 1003a of the housing 1001a may be provided with one or both of a connection terminal for connecting the portable information terminal to an external device and a button for operating the portable information terminal shown in FIG. 9A.

The portable information terminal shown in FIG. 9A serves as one or more of a telephone set, an e-book reader, a personal computer, and a game machine, for example.

A semiconductor device shown in FIG. 9B is an example of a folding portable information terminal The portable information terminal shown in FIG. 9B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal shown in FIG. 9B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with one or both of a connection terminal for connecting the portable information terminal to an external device and a button for operating the portable information terminal shown in FIG. 9B.

The display portion 1002b and the display portion 1005 may display different images or one image. Note that the display portion 1005 is not necessarily provided; a keyboard that is an input device may be provided instead of the display portion 1005.

The portable information terminal shown in FIG. 9B serves as one or more of a telephone set, an e-book reader, a personal computer, and a game machine, for example.

In addition, the structural example of the portable information terminal in FIG. 9A or 9B is shown in FIG. 9C.

The portable information terminal shown in FIG. 9C includes a wireless transmission-reception circuit (also referred to as RF) 1201, a power storage device (also referred to as BT) 1204, a power supply circuit (also referred to as PWRG) 1205, an arithmetic processing circuit (also referred to as PRO) 1206, a memory (also referred to as MEM) 1207, a display control circuit (also referred to as DISPCTL) 1208, and a display panel (also referred to as DISP) 1209.

The wireless transmission-reception circuit 1201 has a function of generating a power supply voltage and a data signal from a received electric wave. The wireless transmission-reception circuit 1201 includes the antenna, the capacitor, the passive element, the control transistor, and the memory circuit in the semiconductor device in any of Embodiments 1 to 4. Further, the wireless transmission-reception circuit 1201 may include functional circuits such as the rectifier circuit, the demodulation circuit, and the modulation circuit in the semiconductor device described in Embodiment 6. The wireless transmission-reception circuit

1201 may also include functional circuits such as an analog baseband circuit and a digital baseband circuit.

The power storage device 1204 has a function of supplying a voltage for generating a power supply voltage. Note that the power storage device 1204 may be recharged depending on the voltage generated by the wireless transmission-reception circuit 1201.

The power supply circuit 1205 has a function of generating a power supply voltage depending on a supplied voltage and supplying the power supply voltage to the arithmetic processing circuit 1206, the memory 1207, the display control circuit 1208, and the display panel 1209.

The arithmetic processing circuit 1206 includes a CPU, a digital signal processor (also referred to as DSP), a memory control circuit, and an interface, for example.

The memory 1207 has a function of writing and reading data according to a signal from the memory control circuit in the arithmetic processing circuit 1206.

As the display panel 1209, a liquid crystal display panel, an EL display panel, or the like can be used, for example. Note that in the case of the semiconductor device shown in FIG. 9B, a plurality of display panels 1209 is provided.

Moreover, an operation example of the portable information terminal shown in FIG. 9C will be described.

First, the wireless transmission-reception circuit 1201 receives an electric wave including data, the power storage device 1204 is recharged, the power supply circuit 1205 generates a power supply voltage, and the arithmetic processing circuit 1206 generates image data. The generated image data is stored in the memory 1207 as data. In addition, the data stored in the memory 1207 is output to the display panel 1209 through the display control circuit 1208, and an image depending on the input image data is displayed by the display panel 1209.

The above is the operation example of the portable information terminal shown in FIG. 9C.

As described with reference to FIGS. 9A to 9C, in an example of the semiconductor device in this embodiment, whether the passive element forms the resonance circuit with another element or not is controlled by controlling an on state or an off state of the control transistor, whereby the resonance frequency of the semiconductor device can be changed as appropriate.

Moreover, in an example of the semiconductor device in this embodiment, the memory circuit includes the transistor with low off-state current, so that the gate voltage of the control transistor can be set in response to data held in the memory circuit just by writing the data to the memory circuit. Further, data in the memory circuit can be easily rewritten. In the memory circuit including the transistor with low off-state current, data (voltage) that is held does not change semipermanently. In other words, the memory circuit including the transistor with low off-state current has a small leakage current and can hold data for a long time even when power is not supplied. Thus, the number of times of setting again the gate voltage of the control transistor can be reduced, so that the resonance frequency of the semiconductor device can be easily set. In addition, power consumption of the semiconductor device can be reduced.

In an example of the semiconductor device in this embodiment, data is transmitted and received wirelessly and the power storage device is recharged wirelessly, so that an external power supply device is unnecessary; therefore, the semiconductor device can be used for a long time even when there is no external power supply device.

(Embodiment 8)

In this embodiment, an example of an insulated gate transistor including an In—Sn—Zn-based oxide as an oxide semiconductor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 3]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 4]}$$

Here, e represents the elementary charge, N represents the average defect density per unit area in a channel, ε represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is 30 nm or less, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[Formula 5]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \qquad \text{[Formula 6]}$$

The right side of Formula 6 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs from Formula 3 and Formula 4. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right)$$ [Formula 7]

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 7 is increased and accordingly the mobility $\mu_1$ is decreased.

Figure 13:
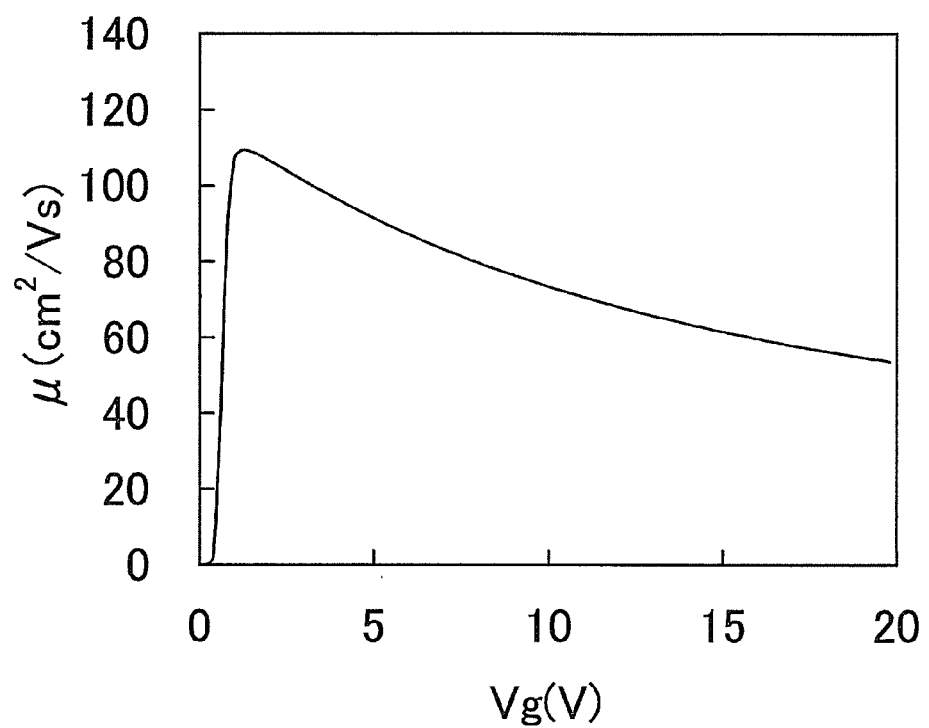
FIG. 13 shows gate voltage dependence of mobility obtained by calculation.

Calculation results of the mobility $\mu_2$ of a transistor whose channel includes an ideal oxide semiconductor without a defect inside the semiconductor are shown in FIG. 13. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 13, the mobility has a peak of 100 cm²/Vs or more at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 14A to 14C, FIGS. 15A to 15C, and FIGS. 16A to 16C. FIGS. 17A and 17B show cross-sectional structures of the transistors used for the calculation. The transistors shown in FIGS. 17A and 17B each include a semiconductor region 1303a and a semiconductor region 1303c which have n⁺-type conductivity in an oxide semiconductor layer. The resistivities of the semiconductor region 1303a and the semiconductor region 1303c are $2 \times 10^{-3}$ Ωcm.

The transistor shown in FIG. 17A is formed over a base insulating layer 1301 and an embedded insulator 1302 which is embedded in the base insulating layer 1301 and formed of aluminum oxide. The transistor includes the semiconductor region 1303a, the semiconductor region 1303c, an intrinsic semiconductor region 1303b serving as a channel formation region therebetween, and a gate 1305. The width of the gate 1305 is 33 nm.

A gate insulating layer 1304 is formed between the gate 1305 and the semiconductor region 1303b. In addition, a sidewall insulator 1306a and a sidewall insulator 1306b are formed on both side surfaces of the gate 1305, and an insulator 1307 is formed over the gate 1305 so as to prevent a short circuit between the gate 1305 and another wiring. The sidewall insulator has a width of 5 nm A source electrode 1308a and a drain electrode 1308b are provided in contact with the semiconductor region 1303a and the semiconductor region 1303c, respectively. Note that the channel width of this transistor is 40 nm.

The transistor shown in FIG. 17B is the same as the transistor shown in FIG. 17A in that it is formed over the base insulating layer 1301 and the embedded insulator 1302 formed of aluminum oxide and that it includes the semiconductor region 1303a, the semiconductor region 1303c, the intrinsic semiconductor region 1303b provided therebetween, the gate 1305 having a width of 33 nm, the gate insulating layer 1304, the sidewall insulator 1306a, the sidewall insulator 1306b, the insulator 1307, the source electrode 1308a, and the drain electrode 1308b.

The transistor shown in FIG. 17B is different from the transistor shown in FIG. 17A in the conductivity type of semiconductor regions under the sidewall insulator 1306a and the sidewall insulator 1306b. In the transistor shown in FIG. 17A, the semiconductor regions under the sidewall insulator 1306a and the sidewall insulator 1306b are part of the semiconductor region 1303a having n⁺-type conductivity and part of the semiconductor region 1303c having n⁺-type conductivity, whereas in the transistor shown in FIG. 17B, the semiconductor regions under the sidewall insulator 1306a and the sidewall insulator 1306b are part of the intrinsic semiconductor region 1303b. In other words, a region having a width of $L_{off}$ which overlaps with neither the semiconductor region 1303a (the semiconductor region 1303c) nor the gate 1305 is provided. This region is called an offset region, and the width $L_{off}$ is called an offset length. As is seen from the drawing, the offset length is equal to the width of the sidewall insulator 1306a (the sidewall insulator 1306b).

Figure 14A:
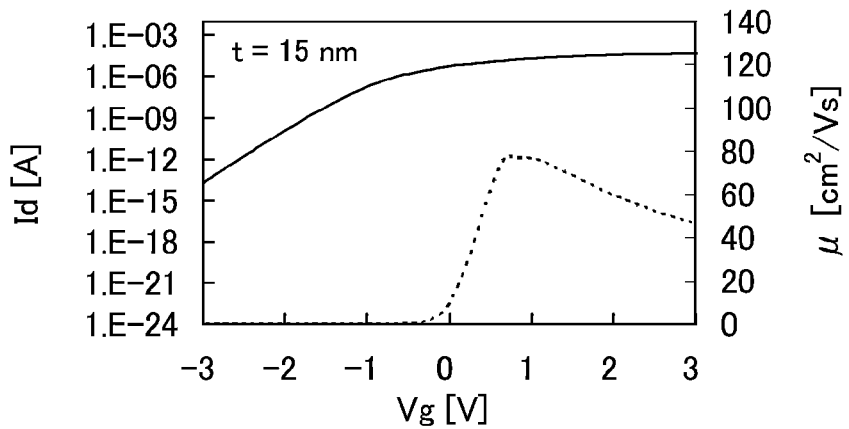
FIGS. 14A to 14C each show gate voltage dependence of drain current and mobility obtained by calculation.
Figure 14B:
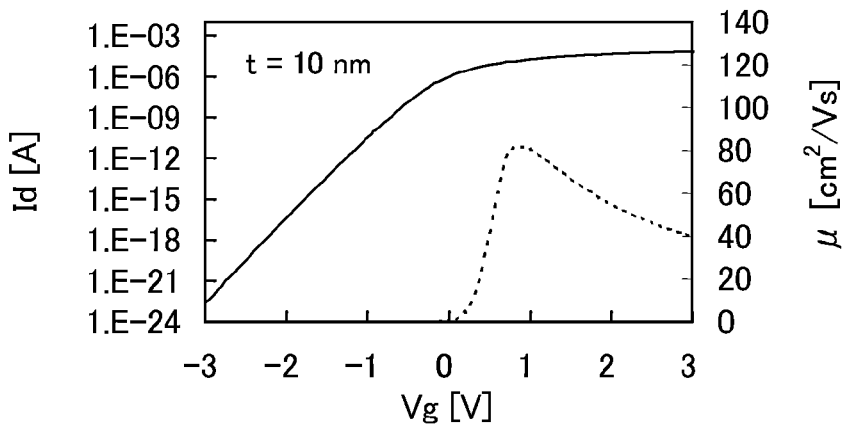
Figure 14C:
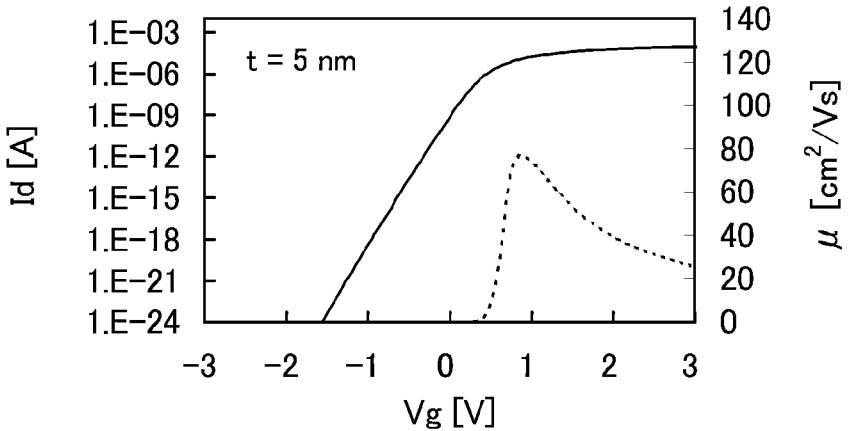

The other parameters used in calculation are as described above. For the calculation, device simulation software Sentaurus Device manufactured by Synopsys, Inc. was used. FIGS. 14A to 14C show the gate voltage ($V_g$: a potential difference between the gate and the source) dependence of the drain current ($I_d$, a solid line) and the mobility (μ, a dotted line) of the transistor having the structure illustrated in FIG. 17A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 14A shows the gate voltage dependence of the transistor in the case where the thickness of the gate insulating layer is 15 nm, FIG. 14B shows that of the transistor in the case where the thickness of the gate insulating layer is 10 nm, and FIG. 14C shows that of the transistor in the case where the thickness of the gate insulating layer is 5 nm As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 15A:
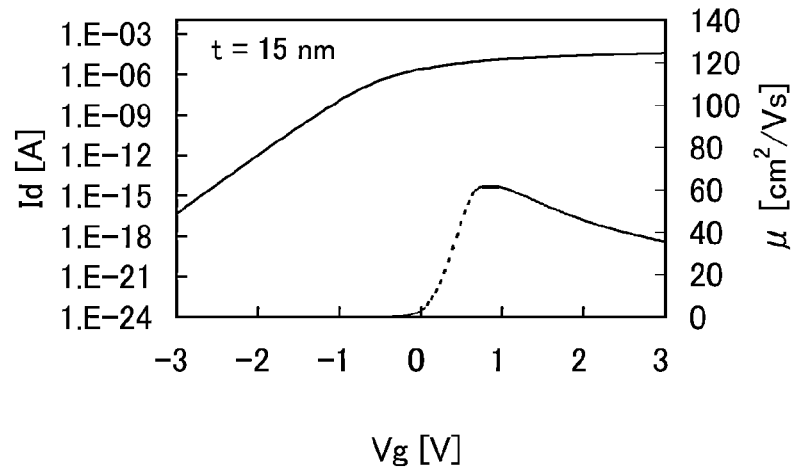
FIGS. 15A to 15C each show gate voltage dependence of drain current and mobility obtained by calculation.
Figure 15B:
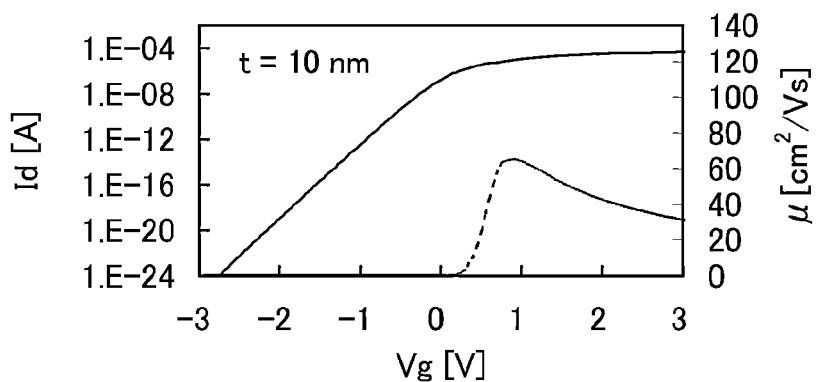
Figure 15C:
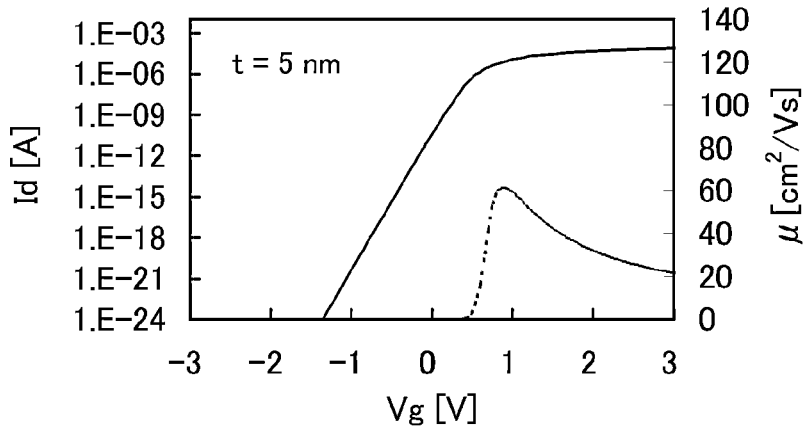

FIGS. 15A to 15C show the gate voltage $V_g$ dependence of the drain current $I_d$ (a solid line) and the mobility μ (a dotted line) of the transistor having the structure illustrated in FIG. 17B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 15A shows the gate voltage dependence of the transistor in the case where the thickness of the gate insulating layer is 15 nm, FIG. 15B shows that of the transistor in the case where the thickness of the gate insulating layer is 10 nm, and FIG. 15C shows that of the transistor in the case where the thickness of the gate insulating layer is 5 nm.

Figure 16A:
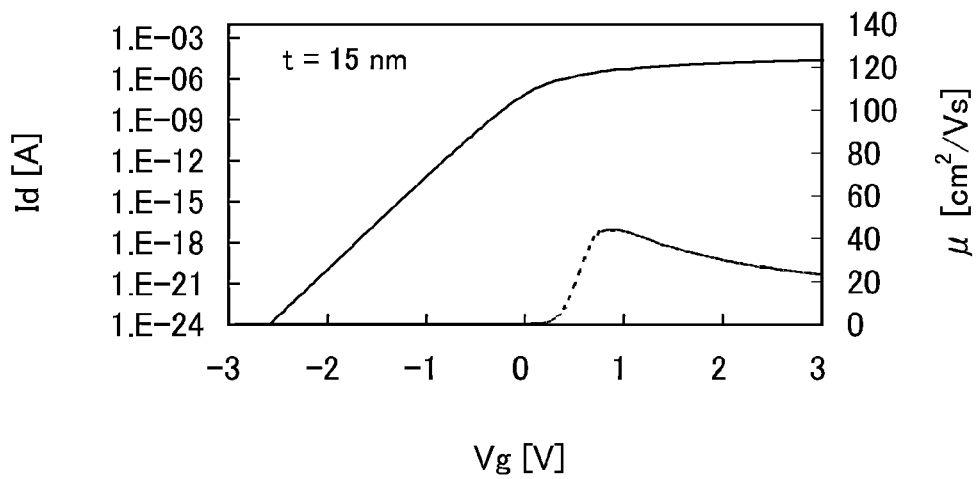
FIGS. 16A to 16C each show gate voltage dependence of drain current and mobility obtained by calculation.
Figure 16B:
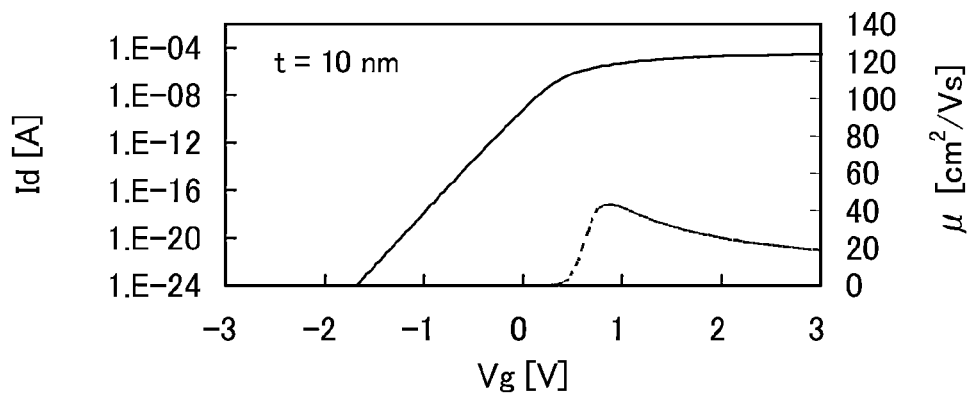
Figure 16C:
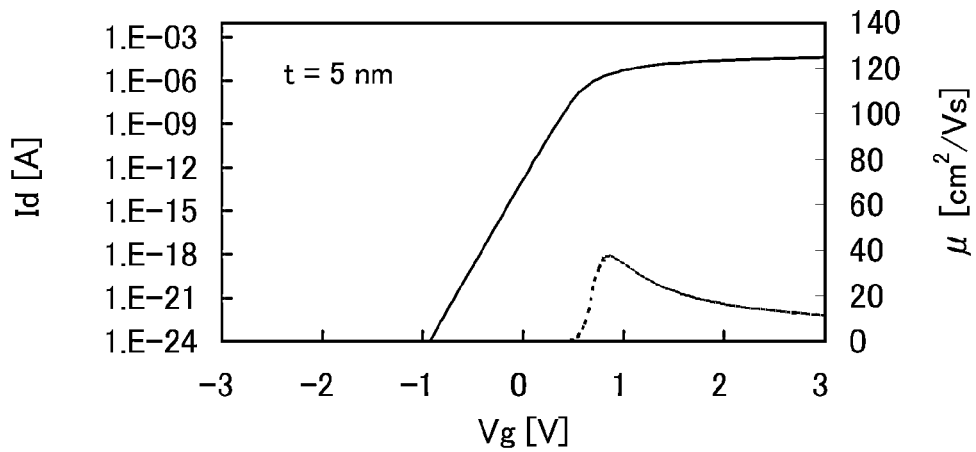
Figure 17A:
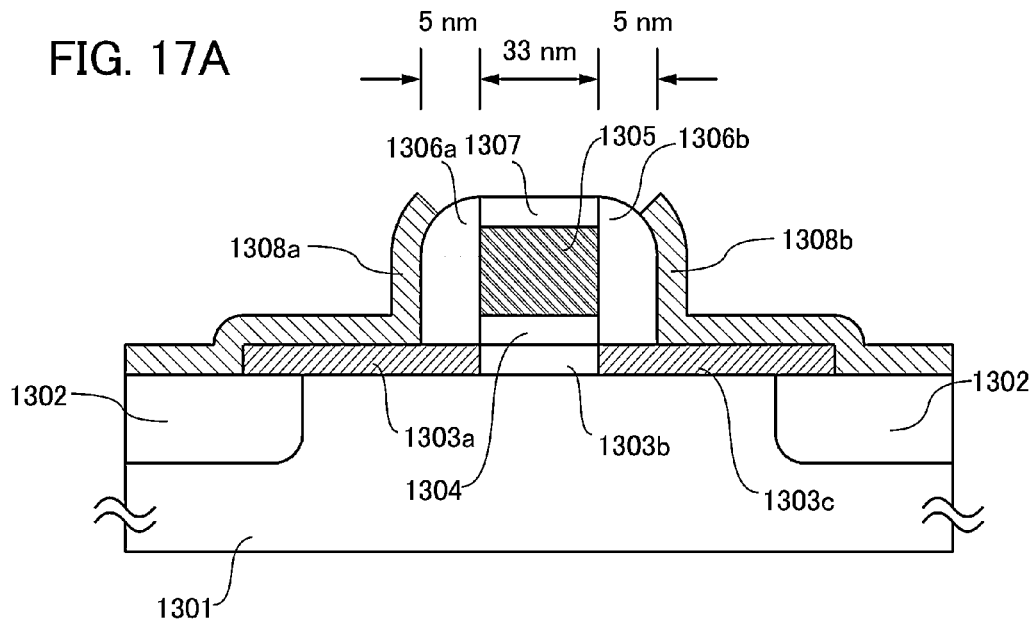
FIGS. 17A and 17B show cross-sectional structures of transistors used for calculation.
Figure 17B:
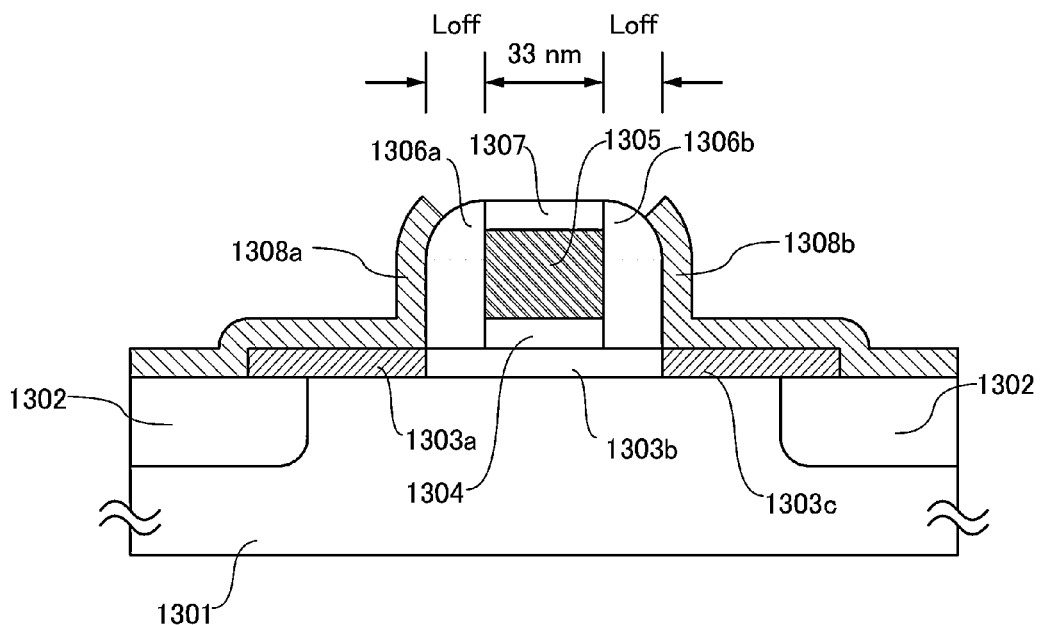

Further, FIGS. 16A to 16C show the gate voltage dependence of the drain current $I_d$ (a solid line) and the mobility μ (a dotted line) of the transistor having the structure illustrated in FIG. 17B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 16A shows the gate voltage dependence of the transistor in the case where the thickness of the gate insulating layer is 15 nm, FIG. 16B shows that of the transistor in the case where the thickness of the gate insulating layer is 10 nm, and FIG. 16C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm$^2$/Vs in FIGS. 14A to 14C, approximately 60 cm$^2$/Vs in FIGS. 15A to 15C, and approximately 40 cm$^2$/Vs in FIGS. 16A to 16C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

(Embodiment 9)

In this embodiment, the experiment results and the like of an insulated gate transistor including an In—Sn—Zn-based oxide as an oxide semiconductor will be described.

A transistor in which an oxide semiconductor including In, Sn, and Zn as main components is used as a channel formation region can have favorable characteristics by depositing the oxide semiconductor while heating a substrate or by performing heat treatment after formation of an oxide semiconductor film. Note that a main component refers to an element included in a composition at 5 atomic % or higher.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 18A:
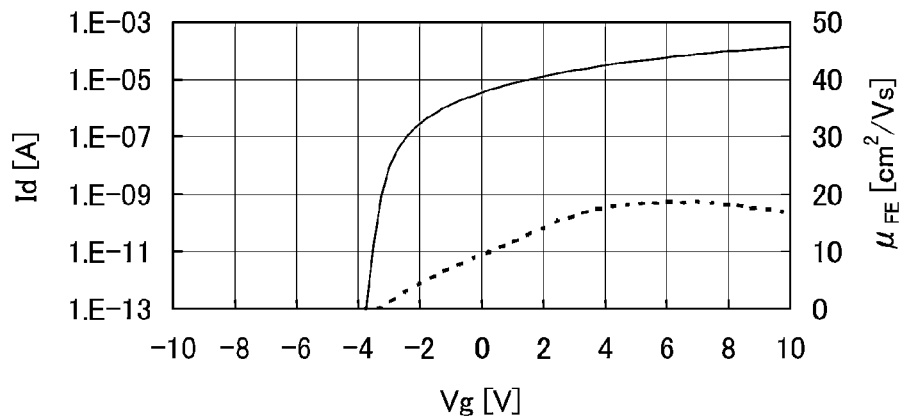
FIGS. 18A to 18C each show characteristics of a transistor using an oxide semiconductor film.
Figure 18B:
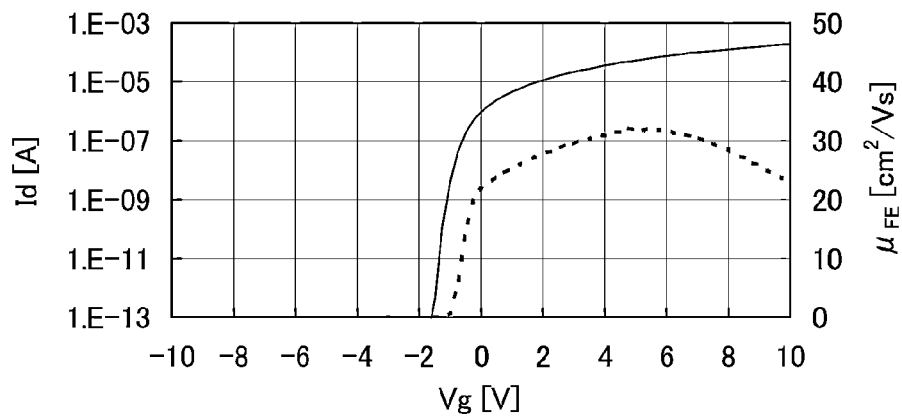
Figure 18C:
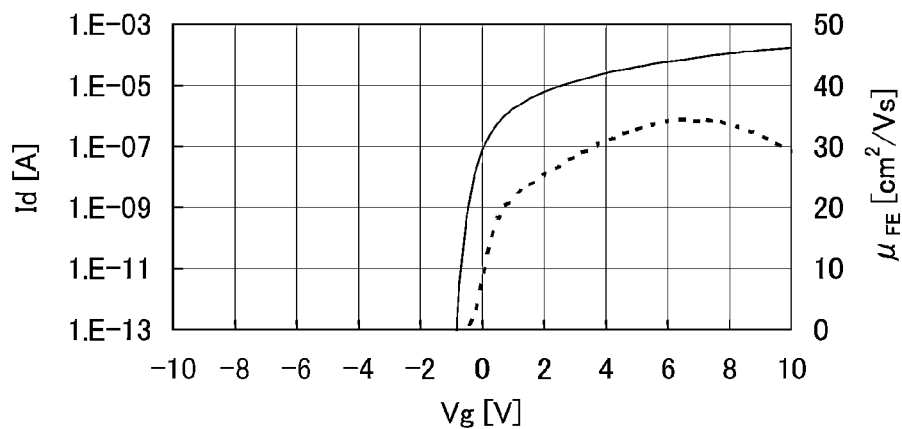

As an example, FIGS. 18A to 18C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 18A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 18B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 18C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an advantageous effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of an impurity by dehydration or dehydrogenation but also by a reduction in interatomic distance due to an increase in density. The oxide semiconductor can be crystallized by being purified by removal of an impurity from the oxide semiconductor. In the case where such a purified non-single-crystal oxide semiconductor is used, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor whose oxide semiconductor film including In, Sn, and Zn as main components, which is formed without heating a substrate intentionally, is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 18A and 18B.

Note that the threshold voltage can also be controlled by changing the ratio of In, Sn, and Zn; when the composition ratio of In, Sn, and Zn is 2:1:3, formation of a normally-off transistor is expected. In addition, a highly crystalline oxide semiconductor film can be obtained by setting the composition ratio of a target as follows: In:Sn:Zn=2:1:3.

The temperature of the intentional heating of the substrate or the temperature of the heat treatment is 150° C. or higher, preferably 200° C. or higher, or more preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for 1 hour, drift of the threshold voltage can be less than ±1.5 V, preferably less than ±1.0 V.

A BT test was performed on the following two transistors: Sample 1 on which heat treatment was not performed after formation of an oxide semiconductor film; and Sample 2 on which heat treatment at 650° C. was performed after formation of an oxide semiconductor film.

First, $V_g I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to the gate insulating layer was 2 MV/cm, and the condition was kept for 1 hour. Next, $V_g$ was set to 0 V. Then, $V_g I_d$ characteristics of the transistors were measured at a substrate temperature of 25° C. and $V_d$ of 10 V. This process is called a positive BT test.

In a similar manner, first, $V_g I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating layer was −2 MV/cm, and the condition was kept for 1 hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 19A:
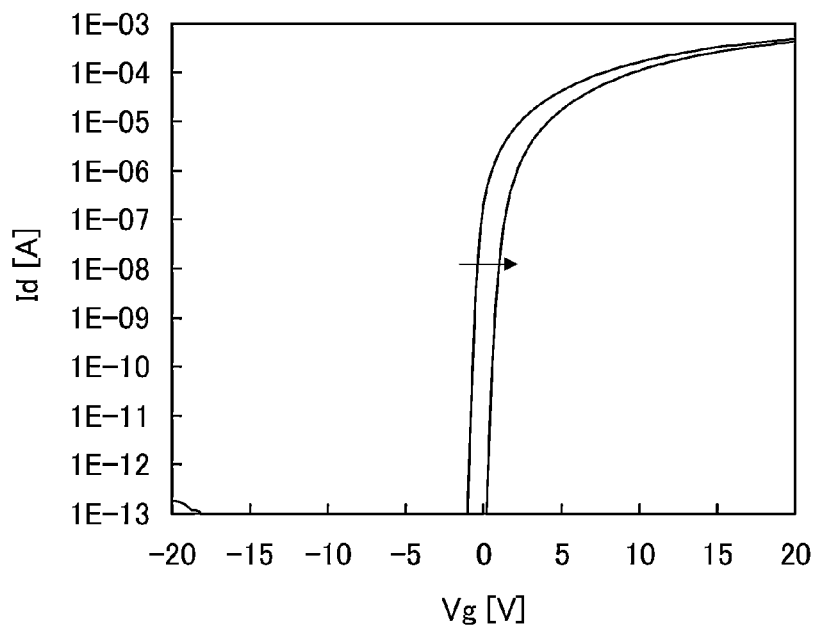
FIGS. 19A and 19B each show $V_g$-$I_d$ characteristics of a transistor of Sample 1 after a BT test.
Figure 19B:
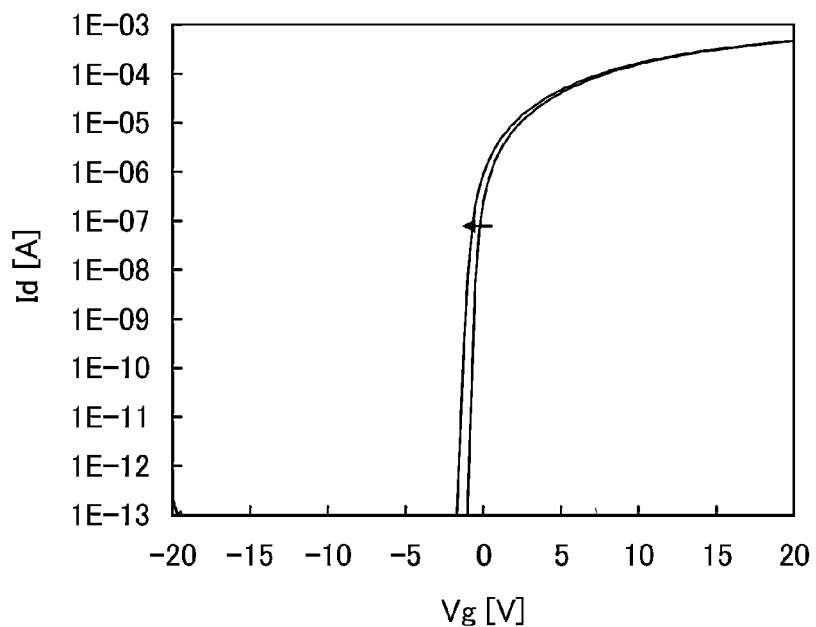
Figure 20A:
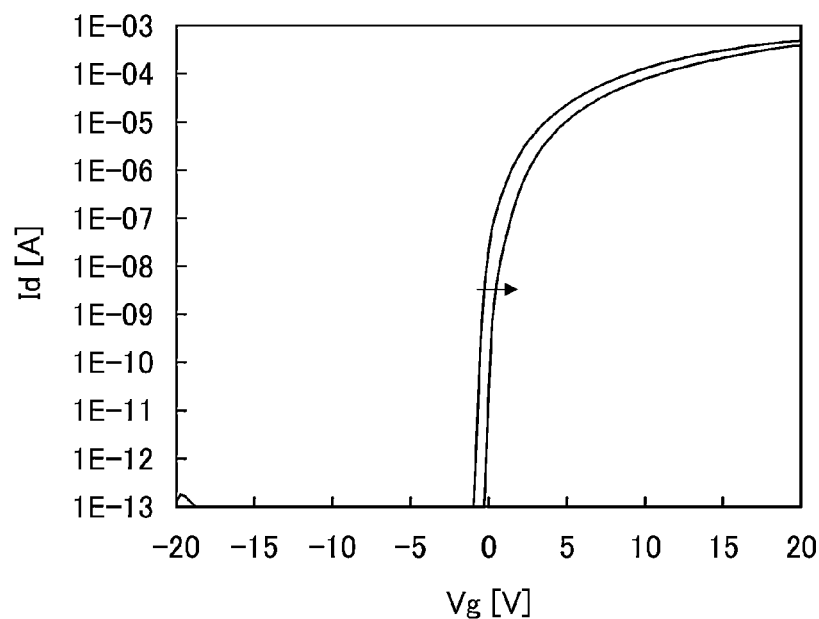
FIGS. 20A and 20B each show $V_g$-$I_d$ characteristics of a transistor of Sample 2 after a BT test.
Figure 20B:
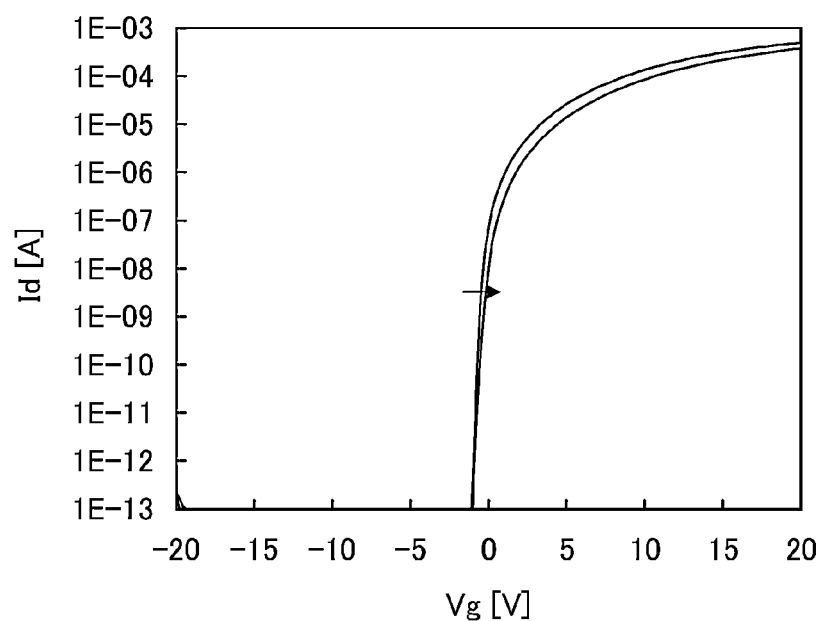

FIGS. 19A and 19B show a result of the positive BT test of Sample 1 and a result of the negative BT test of Sample 1, respectively. FIGS. 20A and 20B show a result of the positive BT test of Sample 2 and a result of the negative BT test of Sample 2, respectively.

The amounts of shift in the threshold voltage of Sample 1 due to the positive BT test and that due to the negative BT test were 1.80 V and −0.42 V, respectively. The amounts of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour without lowering the temperature. A sample manufactured in this manner was used as Sample B.

Figure 21:
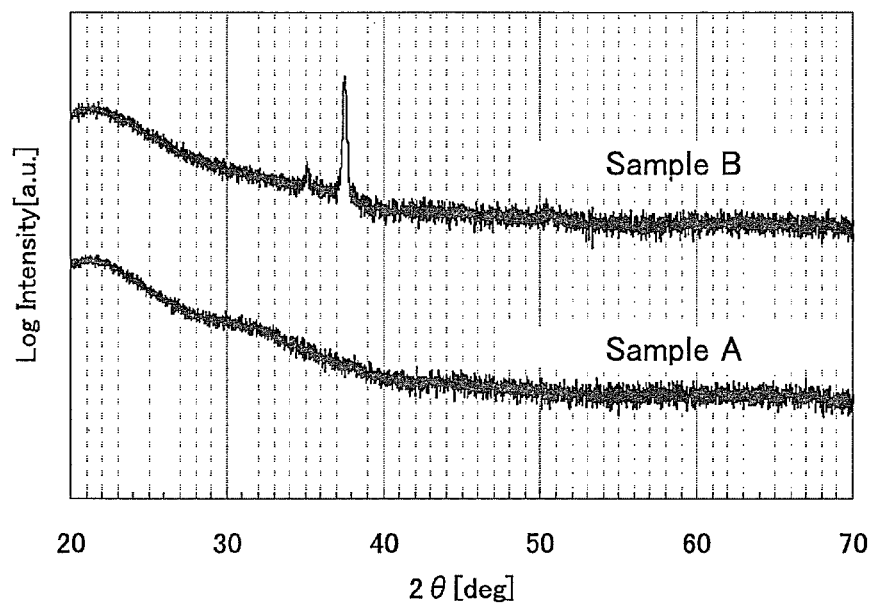
FIG. 21 shows XRD spectra of Sample A and Sample B.

FIG. 21 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating the substrate during deposition of an oxide semiconductor including In, Sn, and Zn as main components and/or by performing heat treatment after the deposition, characteristics of a transistor can be improved.

These substrate heating and heat treatment have an effect of preventing hydrogen or a hydroxyl group, which is an adverse impurity for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 22:
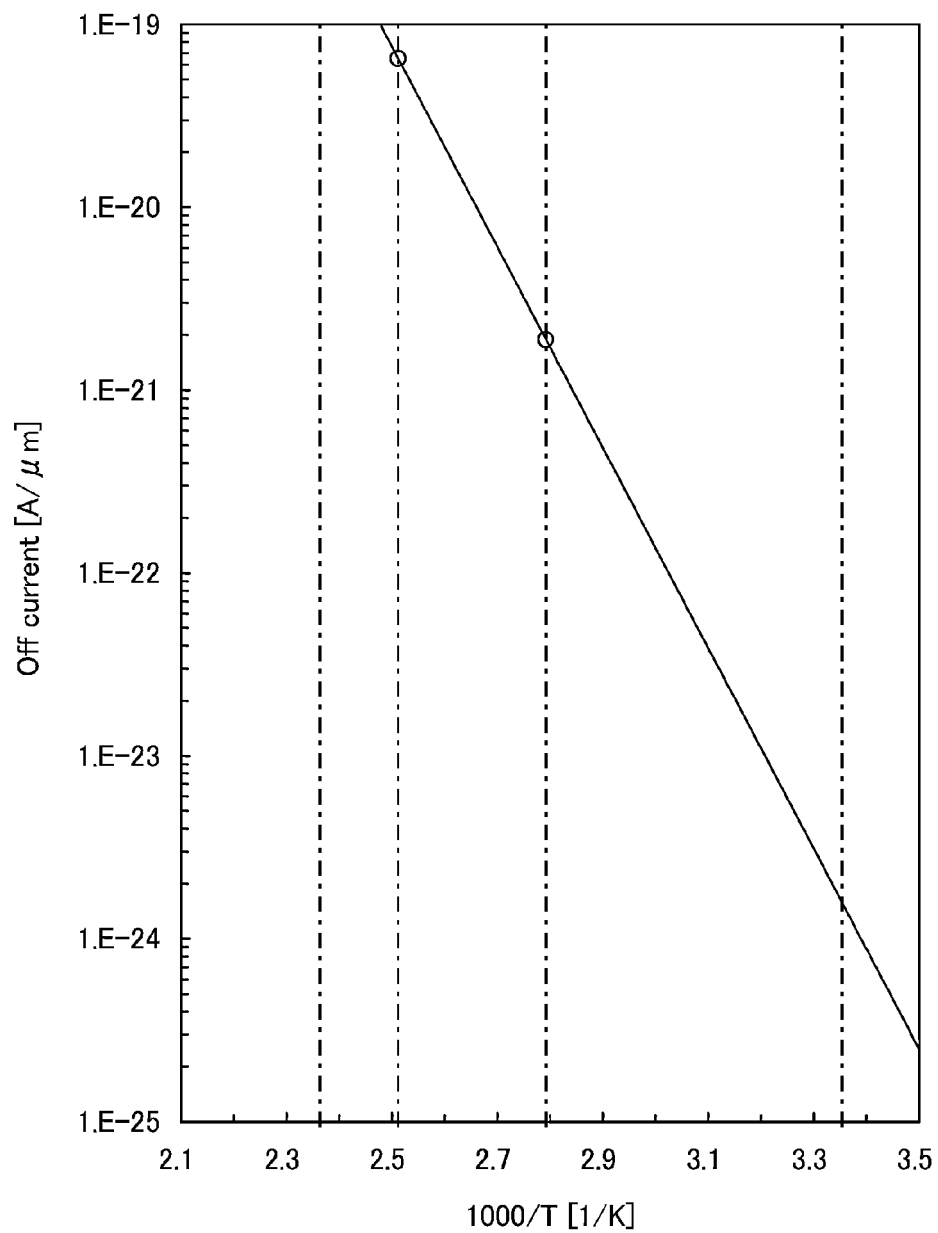
FIG. 22 shows a relation between off-state current and substrate temperature in measurement of a transistor.

FIG. 22 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 22, the off-state current can be 1 aA/μm (1×10⁻¹⁸ A/μm) or lower, 100 zA/μm (1×10⁻¹⁹ A/μm) or lower, and 1 zA/μm (1×10⁻²¹ A/μm) or lower when the substrate temperature is 125° C., 85° C., and room temperature (27° C.), respectively. Preferably, the off-state current can be 0.1 zA/μm (1×10⁻¹⁹ A/μm) or lower, 10 zA/μm (1×10⁻²⁰ A/μm) or lower, and 0.1 zA/μm (1×10⁻²² A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of −70° C. or lower is preferably used as the sputtering gas in order to prevent moisture from being included in the film. In addition, it is preferable to use a target which is purified so as not to include an impurity such as hydrogen or moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of a sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 23:
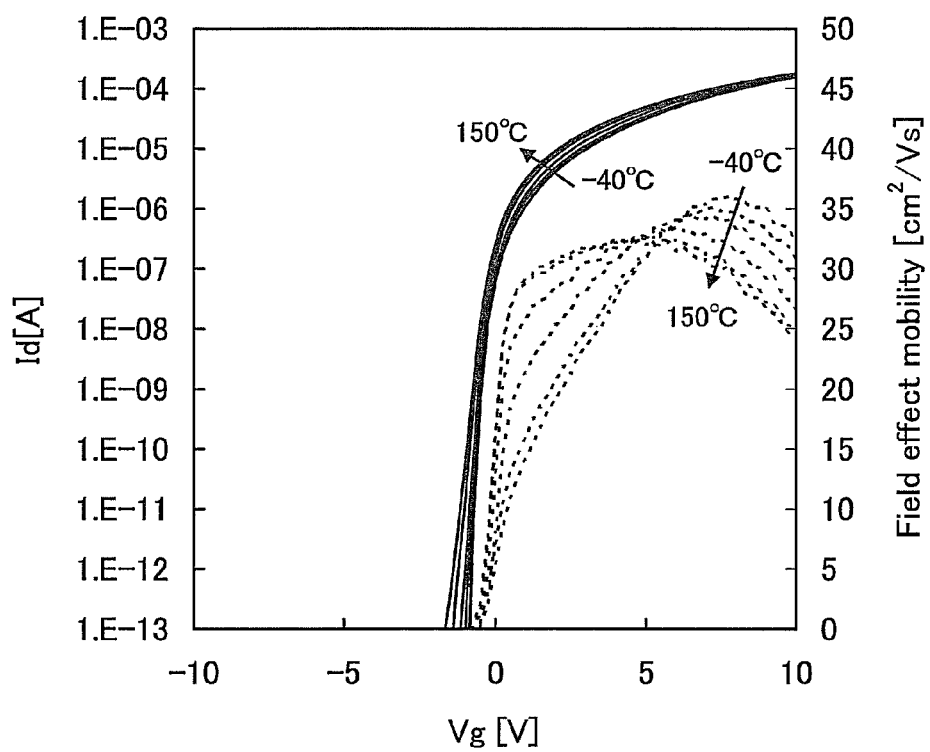
FIG. 23 shows $V_g$ dependence of $I_d$ and field-effect mobility.
Figure 24A:
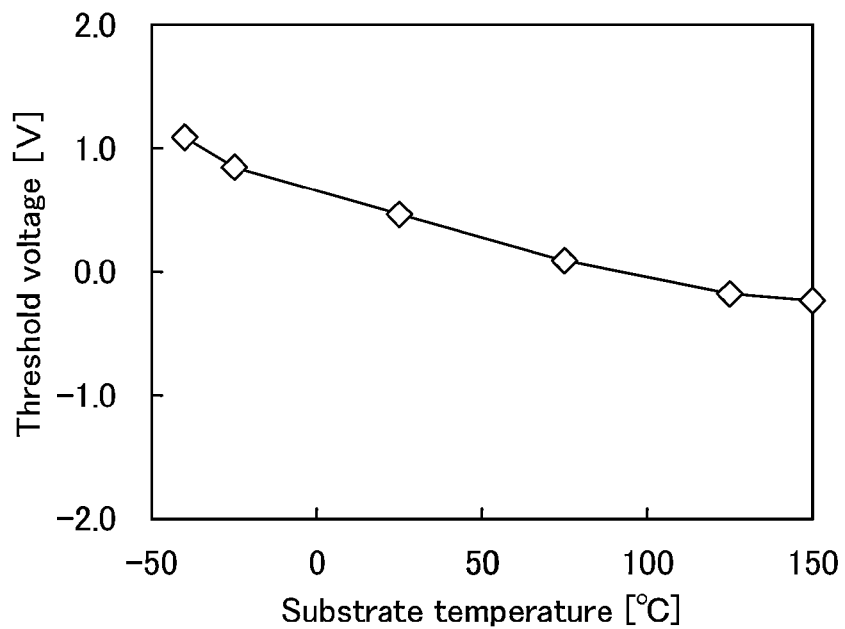
FIGS. 24A and 24B show a relation between substrate temperature and threshold voltage and a relation between substrate temperature and field effect mobility, respectively.

FIG. 23 shows the $V_g$ dependence of $I_d$ (a solid line) and field-effect mobility (a dotted line). FIG. 24A shows a relation between the substrate temperature and the threshold voltage, and FIG. 24B shows a relation between the substrate temperature and the field-effect mobility.

From FIG. 24A, it is found that the threshold voltage gets lower as the substrate temperature increases. Note that the threshold voltage is decreased from 1.09 V to −0.23 V in the range from −40° C. to 150° C.

Figure 24B:
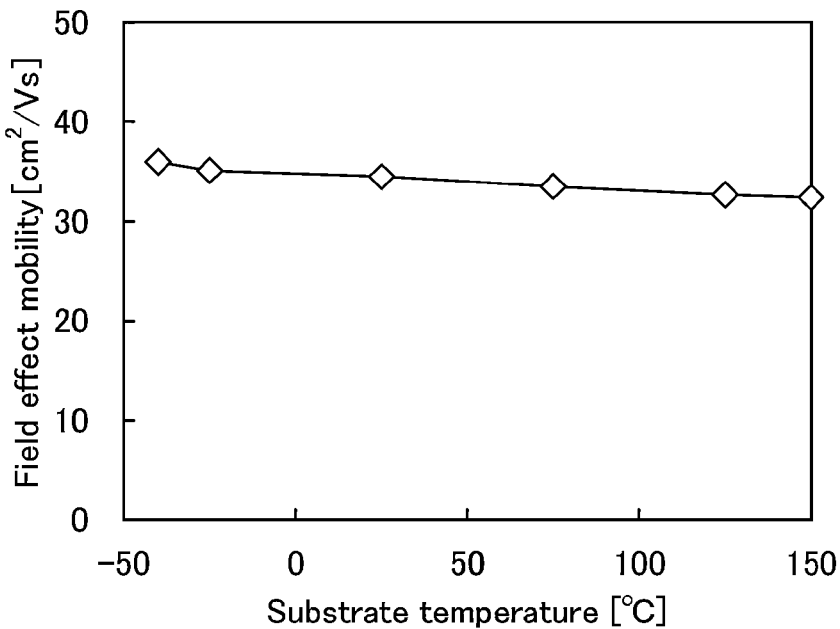

From FIG. 24B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, or more preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operating speed even when a transistor including an oxide semiconductor is also provided in an integrated circuit formed using a Si semiconductor.

EXAMPLE 1

In this example, an example of a transistor in which an In—Sn—Zn—O film is used as an oxide semiconductor film will be described with reference to FIGS. 25A and 25B.

Figure 25A:
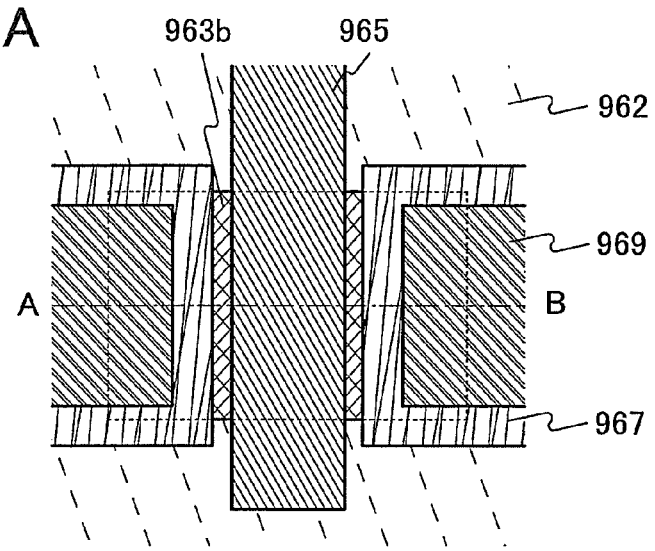
FIGS. 25A and 25B are a top view of a semiconductor device and a cross-sectional view of the semiconductor device.
Figure 25B:
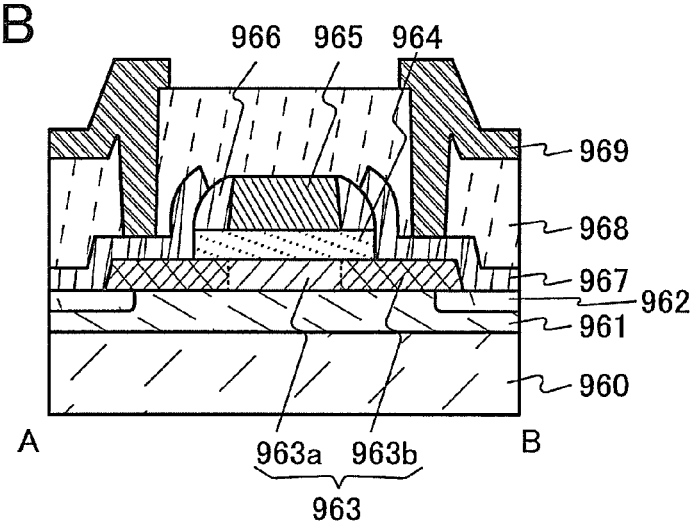

FIGS. 25A and 25B are a top view and a cross-sectional view of a coplanar transistor having a top-gate top-contact structure. FIG. 25A is the top view of the transistor. FIG. 25B shows cross section A-B along dashed-dotted line A-B in FIG. 25A.

The transistor shown in FIG. 25B includes a substrate 960; a base insulating film 961 provided over the substrate 960; a protective insulating film 962 provided in the periphery of the base insulating film 961; an oxide semiconductor film 963 provided over the base insulating film 961 and the protective insulating film 962 and including a high-resistance region 963a and low-resistance regions 963b; a gate insulating layer 964 provided over the oxide semiconductor film 963; a gate electrode 965 provided to overlap with the oxide semiconductor film 963 with the gate insulating layer 964 interposed therebetween; a sidewall insulating film 966 provided in contact with a side surface of the gate electrode 965; a pair of electrodes 967 provided in contact with at least the low-resistance regions 963b; an interlayer insulating film 968 provided to cover at least the oxide semiconductor film 963, the gate electrode 965, and the pair of electrodes 967; and a wiring 969 provided to connect to at least one of the pair of electrodes 967 through an opening formed in the interlayer insulating film 968.

Although not shown, a protective film may be provided to cover the interlayer insulating film 968 and the wiring 969. With the protective film, a minute amount of leakage current generated by surface conduction of the interlayer insulating film 968 can be reduced and thus the off-state current of the transistor can be reduced.

EXAMPLE 2

In this example, another example of a transistor in which an In—Sn—Zn—O film is used as an oxide semiconductor film will be described.

Figure 26A:
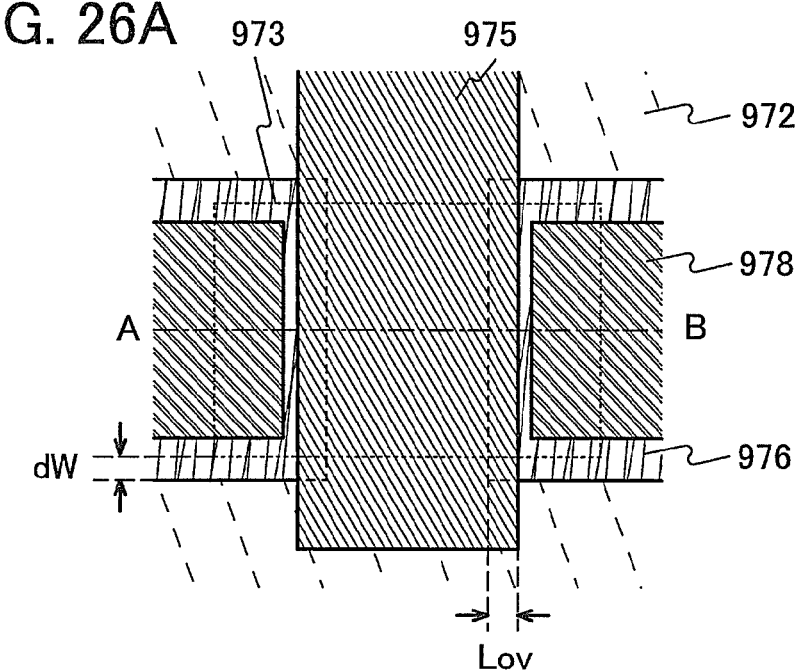
FIGS. 26A and 26B are a top view of a semiconductor device and a cross-sectional view of the semiconductor device.
Figure 26B:
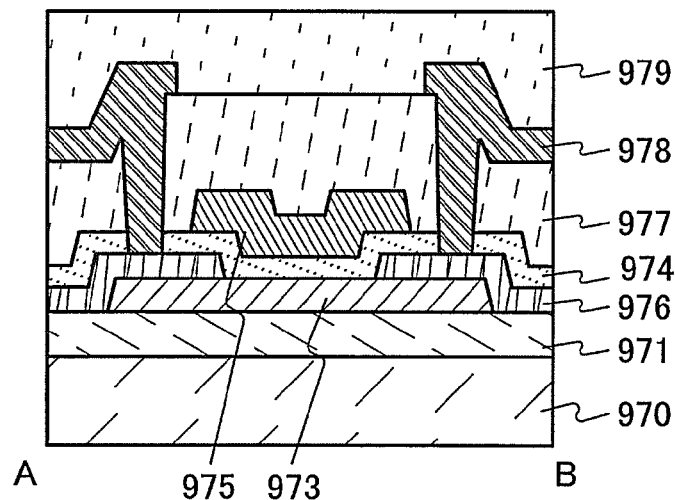

FIGS. 26A and 26B are a top view and a cross-sectional view which show a structure of a transistor manufactured in this example. FIG. 26A is the top view of the transistor. FIG. 26B is a cross-sectional view along dashed-dotted line A-B in FIG. 26A.

The transistor shown in FIG. 26B includes a substrate 970; a base insulating film 971 provided over the substrate 970; an oxide semiconductor film 973 provided over the base insulating film 971; a pair of electrodes 976 provided in contact with the oxide semiconductor film 973; a gate insulating layer 974 provided over the oxide semiconductor film 973 and the pair of electrodes 976; a gate electrode 975 provided to overlap with the oxide semiconductor film 973 with the gate insulating layer 974 interposed therebetween; an interlayer insulating film 977 provided to cover the gate insulating layer 974 and the gate electrode 975; wirings 978 connected to the pair of electrodes 976 through openings formed in the interlayer insulating film 977; and a protective film 979 provided to cover the interlayer insulating film 977 and the wirings 978.

As the substrate 970, a glass substrate was used. As the base insulating film 971, a silicon oxide film was used. As the oxide semiconductor film 973, an In—Sn—Zn—O film was used. As the pair of electrodes 976, a tungsten film was used. As the gate insulating layer 974, a silicon oxide film was used. The gate electrode 975 had a stacked-layer structure of a tantalum nitride film and a tungsten film. The interlayer insulating film 977 had a stacked-layer structure of a silicon oxynitride film and a polyimide film. The wirings 978 each had a stacked-layer structure in which a titanium film, an aluminum film, and a titanium film were formed in this order. As the protective film 979, a polyimide film was used.

Note that in the transistor having the structure shown in FIG. 26A, the width of a portion where the gate electrode 975 overlaps with one of the pair of electrodes 976 is referred to as Lov. Similarly, the width of a portion where the pair of electrodes 976, which does not overlap with the oxide semiconductor film 973, is referred to as dW.

This application is based on Japanese Patent Application serial No. 2011-047460 filed with Japan Patent Office on Mar. 4, 2011 and Japanese Patent Application serial No. 2011-111004 filed with Japan Patent Office on May 18, 2011, the entire contents of which are hereby incorporated by reference.

What is claimed is:

1. A semiconductor device comprising:
a coil;
a capacitor whose first terminal is electrically connected to a first terminal of the coil and whose second terminal is electrically connected to a second terminal of the coil;
a passive element whose first terminal is electrically connected to the first terminal of the coil;
a first transistor whose first terminal is electrically connected to a second terminal of the passive element and whose second terminal is electrically connected to the second terminal of the coil;
a second transistor whose first terminal is electrically connected to a gate of the first transistor;
a second capacitor whose first terminal is electrically connected to the gate of the first transistor;
a third transistor whose first terminal is electrically connected to the first terminal of the coil and whose second terminal is electrically connected to a second terminal of the second capacitor; and
a load whose first terminal is electrically connected to the second terminal of the third transistor and whose second terminal is electrically connected to the second terminal of the coil,
wherein the second transistor comprises a semiconductor layer including a channel, the channel including an oxide semiconductor.

2. The semiconductor device according to claim 1, wherein the passive element is one of a capacitor and a coil.

3. The semiconductor device according to claim 1, further comprising:
a second passive element whose first terminal is electrically connected to the first terminal of the coil; and
a fourth transistor whose first terminal is electrically connected to a second terminal of the second passive element and whose second terminal is electrically connected to the second terminal of the coil.

4. The semiconductor device according to claim 1, wherein the oxide semiconductor comprises an In—Ga—Zn-based oxide semiconductor.

5. The semiconductor device according to claim 1, further comprising a rectifier circuit whose first terminal is electrically connected to the first terminal of the coil and whose second terminal is electrically connected to the second terminal of the coil.

6. A semiconductor device comprising:
a coil;
a capacitor electrically connected to the coil in parallel;
a passive element that forms a resonance circuit with the coil and the capacitor by being electrically connected to the coil and the capacitor in parallel;
a first field effect transistor capable of controlling whether the passive element is electrically connected to the coil and the capacitor in parallel or not; and
a memory circuit,
wherein the memory circuit includes a second field effect transistor that comprises a semiconductor layer including a channel, the channel including an oxide semiconductor,
wherein a voltage of a gate of the first field effect transistor is set in accordance with a voltage of one of a source and a drain of the second field effect transistor, and
wherein a data signal is input to the other one of the source and the drain of the second field effect transistor.

7. The semiconductor device according to claim 6, wherein the passive element is one of a capacitor and a coil.

8. The semiconductor device according to claim 6, further comprising:
a second passive element whose first terminal is electrically connected to the first terminal of the coil; and
a third transistor whose first terminal is electrically connected to a second terminal of the second passive element and whose second terminal is electrically connected to the second terminal of the coil.

9. The semiconductor device according to claim 6, wherein the oxide semiconductor comprises an In—Ga—Zn-based oxide semiconductor.

10. The semiconductor device according to claim 6, further comprising a rectifier circuit whose first terminal is electrically connected to the first terminal of the coil and whose second terminal is electrically connected to the second terminal of the coil.

11. A semiconductor device comprising:
a coil;
a capacitor electrically connected to the coil in parallel;
a passive element that forms a resonance circuit with the coil and the capacitor by being electrically connected to the coil and the capacitor in parallel;
a first field effect transistor capable of controlling whether the passive element is electrically connected to the coil and the capacitor in parallel or not; and
a memory circuit,
wherein the memory circuit includes a second field effect transistor that comprises a semiconductor layer including a channel, the channel including an oxide semiconductor,
wherein one of a source and a drain of the second field effect transistor is electrically connected to a gate of the first field effect transistor, and
wherein the memory circuit includes:
a second capacitor whose first electrode is electrically connected to the gate of the first field effect transistor;
a third field effect transistor, wherein one of a source and a drain of the third field effect transistor is electrically connected to a second electrode of the second capacitor and a voltage of the other one of the source and the drain of the third field effect transistor is changed in accordance with an electric wave received by the coil; and a fourth field effect transistor that comprises a semiconductor layer including a channel, the channel including an oxide semiconductor, wherein one of a source and a drain of the fourth field effect transistor is electrically connected to a gate of the third field effect transistor.

12. The semiconductor device according to claim 11, wherein a data signal is input to the other one of the source and the drain of the second field effect transistor.

13. The semiconductor device according to claim 11,
wherein a first data signal is input to the other one of the source and the drain of the second field effect transistor, and
wherein a second data signal is input to the other one of the source and the drain of the fourth field effect transistor.

14. The semiconductor device according to claim 11, wherein the passive element is one of a capacitor and a coil.

15. The semiconductor device according to claim 11, further comprising:
a second passive element whose first terminal is electrically connected to the first terminal of the coil; and
a third transistor whose first terminal is electrically connected to a second terminal of the second passive element and whose second terminal is electrically connected to the second terminal of the coil.

16. The semiconductor device according to claim 11, wherein each of the oxide semiconductors of the second field effect transistor and the oxide semiconductor of the fourth field effect transistor comprises an In—Ga—Zn-based oxide semiconductor.

17. The semiconductor device according to claim 11, further comprising a rectifier circuit whose first terminal is electrically connected to the first terminal of the coil and whose second terminal is electrically connected to the second terminal of the coil.

18. A semiconductor device comprising:
an antenna;
a capacitor whose first terminal is electrically connected to a first terminal of the antenna and whose second terminal is electrically connected to a second terminal of the antenna;
a passive element whose first terminal is electrically connected to the first terminal of the antenna;
a first transistor whose first terminal is electrically connected to a second terminal of the passive element and whose second terminal is electrically connected to the second terminal of the antenna;
a second transistor whose first terminal is electrically connected to a gate of the first transistor;
a second capacitor whose first terminal is electrically connected to the gate of the first transistor;
a third transistor whose first terminal is electrically connected to the first terminal of the antenna and whose second terminal is electrically connected to a second terminal of the second capacitor; and
a load whose first terminal is electrically connected to the second terminal of the third transistor and whose second terminal is electrically connected to the second terminal of the antenna,
wherein the second transistor comprises a semiconductor layer including a channel, the channel including an oxide semiconductor.

19. The semiconductor device according to claim 18, wherein the passive element is one of a capacitor and a coil.

20. The semiconductor device according to claim 18, further comprising:
a second passive element whose first terminal is electrically connected to the first terminal of the antenna; and
a fourth transistor whose first terminal is electrically connected to a second terminal of the second passive element and whose second terminal is electrically connected to the second terminal of the antenna.

21. The semiconductor device according to claim 18, wherein the oxide semiconductor comprises an In—Ga—Zn-based oxide semiconductor.

22. The semiconductor device according to claim 18, further comprising a rectifier circuit whose first terminal is electrically connected to the first terminal of the antenna and whose second terminal is electrically connected to the second terminal of the antenna.

* * * * *

UNITED STATES PATENT AND TRADEMARK OFFICE
CERTIFICATE OF CORRECTION

PATENT NO. : 8,659,015 B2
APPLICATION NO. : 13/403311
DATED : February 25, 2014
INVENTOR(S) : Seiichi Yoneda It is certified that error appears in the above-identified patent and that said Letters Patent is hereby corrected as shown below:

In the Specification:

At column 5, line 8, "1 zA" should be --10 aA--;

At column 5, line 9, "1 zA" should be --1 aA--;

At column 5, line 12, "100 zA" should be --100 yA--;

At column 39, line 6, "0.1 zA" should be --0.1 aA--.

Signed and Sealed this
Third Day of June, 2014

Michelle K. Lee
*Deputy Director of the United States Patent and Trademark Office*